(12) United States Patent
Yang et al.

(10) Patent No.: US 11,190,128 B2
(45) Date of Patent: Nov. 30, 2021

(54) PARALLEL-CONNECTED SOLAR ROOF TILE MODULES

(71) Applicant: TESLA, INC., Palo Alto, CA (US)

(72) Inventors: Bobby Yang, Dublin, CA (US); Peter P. Nguyen, San Jose, CA (US)

(73) Assignee: Tesla, Inc., Palo Alto, CA (US)

( * ) Notice: Subject to any disclaimer, the term of this patent is extended or adjusted under 35 U.S.C. 154(b) by 0 days.

(21) Appl. No.: 15/906,381

(22) Filed: Feb. 27, 2018

(65) Prior Publication Data

US 2019/0267931 A1 Aug. 29, 2019

(51) Int. Cl.
| | | |
|---|---|---|
| H02S 20/25 | (2014.01) | |
| H02S 40/34 | (2014.01) | |
| H02S 40/36 | (2014.01) | |
| H02S 30/10 | (2014.01) | |
| H02J 3/46 | (2006.01) | |

(Continued)

(52) U.S. Cl.
CPC .............. *H02S 20/25* (2014.12); *H02S 30/10* (2014.12); *H02S 40/34* (2014.12); *H02S 40/36* (2014.12); *H01L 27/1421* (2013.01); *H01L 31/02008* (2013.01); *H01L 31/022441* (2013.01); *H01L 31/044* (2014.12); *H01L 31/0443* (2014.12); *H01L 31/186* (2013.01); *H01L 31/188* (2013.01); *H02J 3/46* (2013.01);
(Continued)

(58) Field of Classification Search
CPC ............. H01L 31/0508; H01L 31/0481; H01L 31/0504; H01L 31/0516; H01L 31/049; H01L 31/0512; H01L 31/0488; H01L 31/048; H01L 31/0443; H01L 27/1421; H01L 31/188; H01L 31/186; H01L 31/02008; H01L 31/022441; H01L 31/044; H01L 31/042; H02S 20/25; H02S 30/10; H02S 40/34; H02S 40/36; H02S 20/24; H02S 20/23; H02S 20/22; H02J 3/46; Y02E 10/50; Y02B 10/10
See application file for complete search history.

(56) References Cited

U.S. PATENT DOCUMENTS

| | | | |
|---|---|---|---|
| 819,360 | A | 5/1906 | Mayer |
| 2,626,907 | A | 1/1953 | De |

(Continued)

FOREIGN PATENT DOCUMENTS

| | | |
|---|---|---|
| CN | 1253381 A | 5/2000 |
| CN | 1416179 A | 5/2003 |

(Continued)

OTHER PUBLICATIONS

Pelisset: "Efficiency of Silicon Thin-Film photovoltaic Modules with a Front Coloured Glass", Proceedings CISBAT 2011, Jan. 1, 2011, pp. 37-42, XP055049695, the Whole Document.

(Continued)

*Primary Examiner* — Michael Y Sun
(74) *Attorney, Agent, or Firm* — Dentons US LLP

(57) ABSTRACT

One embodiment can provide a photovoltaic roof module. The photovoltaic roof module can include a plurality of photovoltaic roof tiles positioned side by side. A respective solar roof tile comprises a plurality of photovoltaic structures positioned between a front cover and a back cover, and the photovoltaic structures are electrically coupled to each other in series. The photovoltaic roof tiles are electrically coupled to each other in parallel.

11 Claims, 17 Drawing Sheets

(51) Int. Cl.

| | |
|---|---|
| H01L 31/18 | (2006.01) |
| H01L 31/02 | (2006.01) |
| H01L 31/0224 | (2006.01) |
| H01L 31/044 | (2014.01) |
| H01L 27/142 | (2014.01) |
| H02S 20/24 | (2014.01) |
| H02S 20/23 | (2014.01) |
| H01L 31/0443 | (2014.01) |
| H02S 20/22 | (2014.01) |

(52) U.S. Cl.
CPC .............. *H02S 20/22* (2014.12); *H02S 20/23* (2014.12); *H02S 20/24* (2014.12)

(56) References Cited

U.S. PATENT DOCUMENTS

| | | | |
|---|---|---|---|
| 2,938,938 A | 5/1960 | Dickson, Jr. | |
| 3,076,861 A | 2/1963 | Samulon | |
| 3,094,439 A | 6/1963 | Mann et al. | |
| 3,116,171 A | 12/1963 | Nielsen et al. | |
| 3,369,939 A | 2/1968 | Myer | |
| 3,459,597 A | 8/1969 | Baron | |
| 3,461,602 A | 8/1969 | Hasel | |
| 3,676,179 A | 7/1972 | Bokros | |
| 3,961,997 A | 6/1976 | Chu | |
| 3,969,163 A | 7/1976 | Wakefield | |
| 4,015,280 A | 3/1977 | Matsushita et al. | |
| 4,082,568 A | 4/1978 | Lindmayer | |
| 4,124,410 A | 11/1978 | Kotval et al. | |
| 4,124,455 A | 11/1978 | Lindmayer | |
| 4,193,975 A | 3/1980 | Kotval et al. | |
| 4,200,621 A | 4/1980 | Liaw et al. | |
| 4,213,798 A | 7/1980 | Arie et al. | |
| 4,228,315 A | 10/1980 | Napoli | |
| 4,239,810 A | 12/1980 | Alameddine | |
| 4,251,285 A | 2/1981 | Yoldas et al. | |
| 4,284,490 A | 8/1981 | Weber | |
| 4,315,096 A | 2/1982 | Tyan et al. | |
| 4,336,648 A | 6/1982 | Pschunder et al. | |
| 4,342,044 A | 7/1982 | Ovshinsky et al. | |
| 4,431,858 A | 2/1984 | Gonzalez et al. | |
| 4,514,579 A | 4/1985 | Hanak | |
| 4,540,843 A | 9/1985 | Gochermann et al. | |
| 4,567,642 A | 2/1986 | Dilts et al. | |
| 4,571,448 A | 2/1986 | Barnett | |
| 4,577,051 A | 3/1986 | Hartman | |
| 4,586,988 A | 5/1986 | Nath et al. | |
| 4,589,191 A | 5/1986 | Green et al. | |
| 4,612,409 A | 9/1986 | Hamakawa et al. | |
| 4,617,421 A | 10/1986 | Nath et al. | |
| 4,633,033 A | 12/1986 | Nath et al. | |
| 4,652,693 A | 3/1987 | Bar-on | |
| 4,657,060 A | 4/1987 | Kaucic | |
| 4,667,060 A | 5/1987 | Spitzer | |
| 4,670,096 A | 6/1987 | Schwirtlich et al. | |
| 4,694,115 A | 9/1987 | Lillington et al. | |
| 4,724,011 A | 2/1988 | Turner | |
| 4,729,970 A | 3/1988 | Nath et al. | |
| 4,753,683 A | 6/1988 | Ellion et al. | |
| 4,771,017 A | 9/1988 | Tobin et al. | |
| 4,784,702 A | 11/1988 | Henri | |
| 4,877,460 A | 10/1989 | Floedl | |
| 4,933,061 A | 6/1990 | Kulkarni et al. | |
| 4,968,384 A | 11/1990 | Asano | |
| 5,053,355 A | 10/1991 | Von | |
| 5,057,163 A | 10/1991 | Barnett et al. | |
| 5,075,763 A | 12/1991 | Spitzer et al. | |
| 5,084,107 A | 1/1992 | Deguchi et al. | |
| 5,118,361 A | 6/1992 | Fraas et al. | |
| 5,118,540 A | 6/1992 | Hutchison | |
| 5,131,933 A | 7/1992 | Floedl et al. | |
| 5,155,051 A | 10/1992 | Noguchi et al. | |
| 5,178,685 A | 1/1993 | Borenstein et al. | |
| 5,181,968 A | 1/1993 | Nath et al. | |
| 5,213,628 A | 5/1993 | Noguchi et al. | |
| 5,217,539 A | 6/1993 | Fraas et al. | |
| 5,279,682 A | 1/1994 | Wald et al. | |
| 5,286,306 A | 2/1994 | Menezes | |
| 5,338,369 A | 8/1994 | Rawlings | |
| 5,364,518 A | 11/1994 | Hartig et al. | |
| 5,401,331 A | 3/1995 | Ciszek | |
| 5,427,961 A | 6/1995 | Takenouchi | |
| 5,455,430 A | 10/1995 | Noguchi et al. | |
| 5,461,002 A | 10/1995 | Safir | |
| 5,563,092 A | 10/1996 | Ohmi | |
| 5,576,241 A | 11/1996 | Sakai | |
| 5,627,081 A | 5/1997 | Tsuo et al. | |
| 5,667,596 A | 9/1997 | Tsuzuki | |
| 5,676,766 A | 10/1997 | Probst et al. | |
| 5,681,402 A | 10/1997 | Ichinose et al. | |
| 5,698,451 A | 12/1997 | Hanoka | |
| 5,705,828 A | 1/1998 | Noguchi et al. | |
| 5,726,065 A | 3/1998 | Szlufcik et al. | |
| 5,808,315 A | 9/1998 | Murakami et al. | |
| 5,814,195 A | 9/1998 | Lehan et al. | |
| 5,903,382 A | 5/1999 | Tench et al. | |
| 5,935,345 A | 8/1999 | Kuznicki | |
| 5,942,048 A | 8/1999 | Fujisaki | |
| 6,017,581 A | 1/2000 | Hooker et al. | |
| 6,034,322 A | 3/2000 | Pollard | |
| 6,091,019 A | 7/2000 | Sakata et al. | |
| 6,103,970 A * | 8/2000 | Kilmer | H01L 31/1852 136/252 |
| 6,133,522 A | 10/2000 | Kataoka | |
| 6,140,570 A | 10/2000 | Kariya | |
| 6,232,545 B1 | 5/2001 | Samaras et al. | |
| 6,303,853 B1 | 10/2001 | Fraas et al. | |
| 6,311,436 B1 | 11/2001 | Mimura | |
| 6,333,457 B1 | 12/2001 | Mulligan et al. | |
| 6,365,824 B1 | 4/2002 | Nakazima | |
| 6,408,786 B1 | 6/2002 | Kennedy et al. | |
| 6,410,843 B1 | 6/2002 | Kishi et al. | |
| 6,441,297 B1 | 8/2002 | Keller et al. | |
| 6,468,828 B1 | 10/2002 | Glatfelter et al. | |
| 6,472,594 B1 | 10/2002 | Ichinose | |
| 6,488,824 B1 | 12/2002 | Hollars et al. | |
| 6,538,193 B1 | 3/2003 | Fraas | |
| 6,552,414 B1 | 4/2003 | Horzel et al. | |
| 6,586,270 B2 | 7/2003 | Tsuzuki et al. | |
| 6,586,271 B2 | 7/2003 | Hanoka | |
| 6,620,645 B2 | 9/2003 | Chandra et al. | |
| 6,672,018 B2 | 1/2004 | Shingleton | |
| 6,683,360 B1 | 1/2004 | Dierickx | |
| 6,736,948 B2 | 5/2004 | Barrett | |
| 6,761,771 B2 | 7/2004 | Satoh et al. | |
| 6,803,513 B2 | 10/2004 | Beernink et al. | |
| 6,841,051 B2 | 1/2005 | Crowley | |
| 6,917,755 B2 | 7/2005 | Nguyen et al. | |
| 6,960,716 B2 | 11/2005 | Matsumi | |
| 7,030,413 B2 | 4/2006 | Nakamura et al. | |
| 7,098,395 B2 | 8/2006 | Hiraishi et al. | |
| 7,128,975 B2 | 10/2006 | Inomata | |
| 7,164,150 B2 | 1/2007 | Terakawa et al. | |
| 7,259,321 B2 | 8/2007 | Oswald | |
| 7,276,724 B2 | 10/2007 | Sheats | |
| 7,328,534 B2 | 2/2008 | Dinwoodie | |
| 7,388,146 B2 | 6/2008 | Fraas et al. | |
| 7,399,385 B2 | 7/2008 | German et al. | |
| 7,506,477 B2 | 3/2009 | Flaherty | |
| 7,534,632 B2 | 5/2009 | Hu et al. | |
| 7,534,956 B2 | 5/2009 | Ichiro | |
| 7,635,810 B2 | 12/2009 | Luch | |
| 7,737,357 B2 | 6/2010 | Cousins | |
| 7,749,883 B2 | 7/2010 | Meeus et al. | |
| 7,769,887 B1 | 8/2010 | Bhattacharyya et al. | |
| 7,772,484 B2 | 8/2010 | Li et al. | |
| 7,777,128 B2 | 8/2010 | Montello et al. | |
| 7,825,329 B2 | 11/2010 | Basol | |
| 7,829,781 B2 | 11/2010 | Montello et al. | |
| 7,829,785 B2 | 11/2010 | Basol | |
| 7,833,808 B2 | 11/2010 | Xu | |
| 7,851,700 B2 | 12/2010 | Luch | |
| 7,858,874 B2 | 12/2010 | Ruskin | |

(56) References Cited

U.S. PATENT DOCUMENTS

| | | |
|---|---|---|
| 7,872,192 B1 | 1/2011 | Fraas et al. |
| 7,902,451 B2 | 3/2011 | Shimizu |
| 7,905,995 B2 | 3/2011 | German et al. |
| 7,964,440 B2 | 6/2011 | Salleo |
| 7,977,220 B2 | 7/2011 | Sanjurjo |
| 8,070,925 B2 | 12/2011 | Hoffman et al. |
| 8,115,093 B2 | 2/2012 | Gui et al. |
| 8,119,901 B2 | 2/2012 | Jang et al. |
| 8,152,536 B2 | 4/2012 | Scherer et al. |
| 8,168,880 B2 | 5/2012 | Jacobs et al. |
| 8,182,662 B2 | 5/2012 | Crowley |
| 8,196,360 B2 | 6/2012 | Metten et al. |
| 8,205,400 B2 | 6/2012 | Allen |
| 8,206,664 B2 | 6/2012 | Lin |
| 8,209,920 B2 | 7/2012 | Krause et al. |
| 8,222,513 B2 | 7/2012 | Luch |
| 8,222,516 B2 | 7/2012 | Cousins |
| 8,258,050 B2 | 9/2012 | Cho et al. |
| 8,276,329 B2 | 10/2012 | Lenox |
| 8,343,795 B2 | 1/2013 | Luo et al. |
| 8,471,141 B2 | 6/2013 | Stancel |
| 8,569,096 B1 | 10/2013 | Babayan et al. |
| 8,586,857 B2 | 11/2013 | Everson et al. |
| 8,664,030 B2 | 3/2014 | Luch |
| 8,671,630 B2 | 3/2014 | Lena et al. |
| 8,674,377 B2 | 3/2014 | Farquhar |
| 8,686,283 B2 | 4/2014 | Heng et al. |
| 8,701,360 B2 | 4/2014 | Ressler |
| 8,713,861 B2 | 5/2014 | Desloover |
| 8,815,631 B2 | 8/2014 | Cousins |
| 8,822,810 B2 | 9/2014 | Luch |
| 9,029,181 B2 | 5/2015 | Rhodes et al. |
| 9,038,330 B2 | 5/2015 | Bellavia |
| 9,147,788 B2 | 9/2015 | Degroot et al. |
| 9,150,966 B2 | 10/2015 | Xu |
| 9,206,520 B2 | 12/2015 | Barr |
| 9,287,431 B2 | 3/2016 | Mascarenhas et al. |
| 9,343,592 B2 | 5/2016 | Hunt |
| 9,362,527 B2 | 6/2016 | Takemura |
| 9,412,884 B2 | 8/2016 | Heng |
| 9,525,092 B2 | 12/2016 | Mayer |
| 9,761,744 B2 | 9/2017 | Wang |
| 9,825,582 B2 | 11/2017 | Fernandes |
| 9,899,554 B2 | 2/2018 | Yang |
| 9,966,487 B2 | 5/2018 | Magnusdottir |
| 2001/0008143 A1 | 7/2001 | Sasaoka et al. |
| 2001/0023702 A1 | 9/2001 | Nakagawa et al. |
| 2001/0054435 A1 | 12/2001 | Nagao |
| 2002/0015782 A1 | 2/2002 | Abys |
| 2002/0015881 A1 | 2/2002 | Nakamura et al. |
| 2002/0072207 A1 | 6/2002 | Andoh |
| 2002/0086456 A1 | 7/2002 | Cunningham et al. |
| 2002/0176404 A1 | 11/2002 | Girard |
| 2002/0189939 A1 | 12/2002 | German et al. |
| 2003/0000568 A1 | 1/2003 | Gonsiorawski |
| 2003/0000571 A1 | 1/2003 | Wakuda et al. |
| 2003/0034062 A1 | 2/2003 | Stern et al. |
| 2003/0042516 A1 | 3/2003 | Forbes et al. |
| 2003/0070705 A1 | 4/2003 | Hayden et al. |
| 2003/0097447 A1 | 5/2003 | Johnston |
| 2003/0116185 A1 | 6/2003 | Oswald |
| 2003/0118865 A1 | 6/2003 | Marks et al. |
| 2003/0121228 A1 | 7/2003 | Stoehr et al. |
| 2003/0136440 A1 | 7/2003 | Machida et al. |
| 2003/0168578 A1 | 9/2003 | Taguchi et al. |
| 2003/0180983 A1 | 9/2003 | Oswald |
| 2003/0183270 A1 | 10/2003 | Falk et al. |
| 2003/0201007 A1 | 10/2003 | Fraas et al. |
| 2004/0035458 A1 | 2/2004 | Beernink et al. |
| 2004/0065363 A1 | 4/2004 | Fetzer et al. |
| 2004/0094196 A1 | 5/2004 | Shaheen et al. |
| 2004/0103937 A1 | 6/2004 | Bilyalov et al. |
| 2004/0112419 A1 | 6/2004 | Boulanger |
| 2004/0112426 A1 | 6/2004 | Hagino |
| 2004/0123897 A1 | 7/2004 | Ojima et al. |
| 2004/0126213 A1 | 7/2004 | Pelzmann et al. |
| 2004/0135979 A1 | 7/2004 | Hazelton |
| 2004/0152326 A1 | 8/2004 | Inomata |
| 2004/0185683 A1 | 9/2004 | Nakamura |
| 2004/0200520 A1 | 10/2004 | Mulligan et al. |
| 2004/0261840 A1 | 12/2004 | Schmit |
| 2005/0009319 A1 | 1/2005 | Abe |
| 2005/0012095 A1 | 1/2005 | Niira et al. |
| 2005/0022746 A1 | 2/2005 | Lampe et al. |
| 2005/0022861 A1 | 2/2005 | Rose et al. |
| 2005/0039788 A1 | 2/2005 | Blieske |
| 2005/0061665 A1 | 3/2005 | Pavani et al. |
| 2005/0062041 A1 | 3/2005 | Terakawa et al. |
| 2005/0064247 A1 | 3/2005 | Sane et al. |
| 2005/0074954 A1 | 4/2005 | Yamanaka |
| 2005/0109388 A1 | 5/2005 | Murakami et al. |
| 2005/0126622 A1 | 6/2005 | Mukai et al. |
| 2005/0133084 A1 | 6/2005 | Joge et al. |
| 2005/0172996 A1 | 8/2005 | Hacke et al. |
| 2005/0178662 A1 | 8/2005 | Wurczinger |
| 2005/0189015 A1 | 9/2005 | Rohatgi et al. |
| 2005/0199279 A1 | 9/2005 | Yoshimine et al. |
| 2005/0252544 A1 | 11/2005 | Rohatgi et al. |
| 2005/0257823 A1 | 11/2005 | Zwanenburg |
| 2005/0263178 A1 | 12/2005 | Montello et al. |
| 2005/0268963 A1 | 12/2005 | Jordan |
| 2006/0012000 A1 | 1/2006 | Estes et al. |
| 2006/0048798 A1 | 3/2006 | Mccoy |
| 2006/0060238 A1 | 3/2006 | Hacke et al. |
| 2006/0060791 A1 | 3/2006 | Hazelton |
| 2006/0086620 A1 | 4/2006 | Chase |
| 2006/0130891 A1 | 6/2006 | Carlson |
| 2006/0154389 A1 | 7/2006 | Doan |
| 2006/0204730 A1 | 9/2006 | Nakamura |
| 2006/0213548 A1 | 9/2006 | Bachrach et al. |
| 2006/0231803 A1 | 10/2006 | Wang et al. |
| 2006/0255340 A1 | 11/2006 | Manivannan et al. |
| 2006/0260673 A1 | 11/2006 | Takeyama |
| 2006/0272698 A1 | 12/2006 | Durvasula |
| 2006/0283496 A1 | 12/2006 | Okamoto et al. |
| 2006/0283499 A1 | 12/2006 | Terakawa et al. |
| 2007/0023081 A1 | 2/2007 | Johnson et al. |
| 2007/0023082 A1 | 2/2007 | Manivannan et al. |
| 2007/0029186 A1 | 2/2007 | Krasnov et al. |
| 2007/0108437 A1 | 5/2007 | Tavkhelidze |
| 2007/0110975 A1 | 5/2007 | Schneweis |
| 2007/0132034 A1 | 6/2007 | Curello et al. |
| 2007/0137699 A1 | 6/2007 | Manivannan et al. |
| 2007/0148336 A1 | 6/2007 | Bachrach et al. |
| 2007/0186853 A1 | 8/2007 | Gurary et al. |
| 2007/0186968 A1 | 8/2007 | Nakauchi et al. |
| 2007/0186970 A1 | 8/2007 | Takahashi et al. |
| 2007/0187652 A1 | 8/2007 | Konno |
| 2007/0202029 A1 | 8/2007 | Burns et al. |
| 2007/0235077 A1 | 10/2007 | Nagata et al. |
| 2007/0235829 A1 | 10/2007 | Levine et al. |
| 2007/0256728 A1 | 11/2007 | Cousins |
| 2007/0274504 A1 | 11/2007 | Maes |
| 2007/0283996 A1 | 12/2007 | Hachtmann et al. |
| 2007/0283997 A1 | 12/2007 | Hachtmann et al. |
| 2008/0000522 A1 | 1/2008 | Johnson et al. |
| 2008/0011350 A1 | 1/2008 | Luch |
| 2008/0035489 A1 | 2/2008 | Allardyce et al. |
| 2008/0041436 A1 | 2/2008 | Lau et al. |
| 2008/0041437 A1 | 2/2008 | Yamaguchi |
| 2008/0047602 A1 | 2/2008 | Krasnov |
| 2008/0047604 A1 | 2/2008 | Korevaar et al. |
| 2008/0053519 A1 | 3/2008 | Pearce et al. |
| 2008/0061293 A1 | 3/2008 | Ribeyron et al. |
| 2008/0083453 A1* | 4/2008 | Rose ............ H01L 31/02013 136/256 |
| 2008/0092942 A1 | 4/2008 | Kinsey et al. |
| 2008/0092947 A1 | 4/2008 | Lopatin et al. |
| 2008/0121272 A1 | 5/2008 | Besser et al. |
| 2008/0121276 A1 | 5/2008 | Lopatin et al. |
| 2008/0121932 A1 | 5/2008 | Ranade |
| 2008/0128013 A1 | 6/2008 | Lopatin et al. |
| 2008/0128017 A1 | 6/2008 | Ford |
| 2008/0135085 A1 | 6/2008 | Corrales |

(56) References Cited

U.S. PATENT DOCUMENTS

| | | |
|---|---|---|
| 2008/0149161 A1 | 6/2008 | Nishida et al. |
| 2008/0149163 A1 | 6/2008 | Gangemi |
| 2008/0156370 A1 | 7/2008 | Abdallah et al. |
| 2008/0173347 A1 | 7/2008 | Korevaar et al. |
| 2008/0173350 A1 | 7/2008 | Choi et al. |
| 2008/0178928 A1 | 7/2008 | Warfield et al. |
| 2008/0196757 A1 | 8/2008 | Yoshimine |
| 2008/0202577 A1 | 8/2008 | Hieslmair |
| 2008/0202582 A1 | 8/2008 | Noda |
| 2008/0216891 A1 | 9/2008 | Harkness et al. |
| 2008/0223439 A1 | 9/2008 | Deng et al. |
| 2008/0230122 A1 | 9/2008 | Terakawa |
| 2008/0251114 A1 | 10/2008 | Tanaka et al. |
| 2008/0251117 A1 | 10/2008 | Schubert et al. |
| 2008/0264477 A1 | 10/2008 | Moslehi |
| 2008/0276983 A1 | 11/2008 | Drake et al. |
| 2008/0283115 A1 | 11/2008 | Fukawa et al. |
| 2008/0302030 A1 | 12/2008 | Stancel et al. |
| 2008/0303503 A1 | 12/2008 | Wolfs |
| 2008/0308145 A1 | 12/2008 | Krasnov et al. |
| 2009/0007965 A1 | 1/2009 | Rohatgi et al. |
| 2009/0014055 A1 | 1/2009 | Beck et al. |
| 2009/0056805 A1 | 3/2009 | Barnett et al. |
| 2009/0065043 A1 | 3/2009 | Hadorn et al. |
| 2009/0078318 A1 | 3/2009 | Meyers et al. |
| 2009/0084439 A1 | 4/2009 | Lu et al. |
| 2009/0101192 A1 | 4/2009 | Kothari |
| 2009/0101872 A1 | 4/2009 | Young et al. |
| 2009/0120492 A1 | 5/2009 | Sinha |
| 2009/0120497 A1 | 5/2009 | Schetty |
| 2009/0133739 A1 | 5/2009 | Shiao |
| 2009/0133740 A1 | 5/2009 | Shiao |
| 2009/0139512 A1 | 6/2009 | Lima |
| 2009/0151771 A1 | 6/2009 | Kothari et al. |
| 2009/0151783 A1 | 6/2009 | Lu et al. |
| 2009/0155028 A1 | 6/2009 | Boguslavskiy et al. |
| 2009/0160259 A1 | 6/2009 | Naiknaware et al. |
| 2009/0188561 A1 | 7/2009 | Aiken et al. |
| 2009/0194233 A1 | 8/2009 | Tamura et al. |
| 2009/0211627 A1 | 8/2009 | Meier et al. |
| 2009/0221111 A1 | 9/2009 | Frolov et al. |
| 2009/0229660 A1 | 9/2009 | Takizawa et al. |
| 2009/0229854 A1 | 9/2009 | Fredenberg et al. |
| 2009/0233083 A1 | 9/2009 | Inoue |
| 2009/0239331 A1 | 9/2009 | Xu et al. |
| 2009/0242021 A1 | 10/2009 | Petkie |
| 2009/0250108 A1 | 10/2009 | Zhou et al. |
| 2009/0255574 A1 | 10/2009 | Yu et al. |
| 2009/0260689 A1 | 10/2009 | Nishi et al. |
| 2009/0272419 A1 | 11/2009 | Sakamoto et al. |
| 2009/0277491 A1 | 11/2009 | Nakamura et al. |
| 2009/0283138 A1 | 11/2009 | Lin et al. |
| 2009/0283145 A1 | 11/2009 | Kim et al. |
| 2009/0287446 A1 | 11/2009 | Wang |
| 2009/0293948 A1 | 12/2009 | Tucci et al. |
| 2009/0301549 A1 | 12/2009 | Moslehi |
| 2009/0308435 A1 | 12/2009 | Caiger |
| 2009/0308439 A1 | 12/2009 | Adibi et al. |
| 2009/0317934 A1 | 12/2009 | Scherff et al. |
| 2009/0320897 A1 | 12/2009 | Shimomura |
| 2010/0000603 A1 | 1/2010 | Tsuzuki |
| 2010/0006145 A1 | 1/2010 | Lee |
| 2010/0006147 A1 | 1/2010 | Takeshi |
| 2010/0012172 A1 | 1/2010 | Meakin et al. |
| 2010/0015756 A1 | 1/2010 | Weidman et al. |
| 2010/0018568 A1 | 1/2010 | Nakata |
| 2010/0043863 A1 | 2/2010 | Wudu et al. |
| 2010/0065111 A1 | 3/2010 | Fu et al. |
| 2010/0068890 A1 | 3/2010 | Stockum et al. |
| 2010/0084009 A1 | 4/2010 | Carlson et al. |
| 2010/0087031 A1 | 4/2010 | Veschetti et al. |
| 2010/0108134 A1 | 5/2010 | Ravi |
| 2010/0116325 A1 | 5/2010 | Nikoonahad |
| 2010/0124619 A1 | 5/2010 | Xu et al. |
| 2010/0131108 A1 | 5/2010 | Meyer |
| 2010/0132762 A1 | 6/2010 | Graham |
| 2010/0132774 A1 | 6/2010 | Borden |
| 2010/0132792 A1 | 6/2010 | Kim et al. |
| 2010/0147363 A1 | 6/2010 | Huang |
| 2010/0147364 A1 | 6/2010 | Gonzalez et al. |
| 2010/0154869 A1 | 6/2010 | Oh et al. |
| 2010/0169478 A1 | 7/2010 | Saha et al. |
| 2010/0175743 A1 | 7/2010 | Gonzalez et al. |
| 2010/0180929 A1 | 7/2010 | Raymond |
| 2010/0186802 A1 | 7/2010 | Borden |
| 2010/0193014 A1 | 8/2010 | Johnson et al. |
| 2010/0218799 A1 | 9/2010 | Stefani |
| 2010/0224230 A1 | 9/2010 | Luch |
| 2010/0229914 A1 | 9/2010 | Adriani et al. |
| 2010/0236612 A1 | 9/2010 | Khajehoddin et al. |
| 2010/0240172 A1 | 9/2010 | Rana et al. |
| 2010/0243021 A1 | 9/2010 | Lee et al. |
| 2010/0243059 A1 | 9/2010 | Okaniwa |
| 2010/0269904 A1 | 10/2010 | Cousins |
| 2010/0279492 A1 | 11/2010 | Yang |
| 2010/0282293 A1 | 11/2010 | Meyer et al. |
| 2010/0295091 A1 | 11/2010 | Strzegowski et al. |
| 2010/0300506 A1 | 12/2010 | Heng et al. |
| 2010/0300507 A1 | 12/2010 | Heng et al. |
| 2010/0300525 A1 | 12/2010 | Lim et al. |
| 2010/0313877 A1 | 12/2010 | Bellman et al. |
| 2010/0326518 A1 | 12/2010 | Juso et al. |
| 2011/0005569 A1 | 1/2011 | Sauar et al. |
| 2011/0005920 A1 | 1/2011 | Ivanov et al. |
| 2011/0023937 A1 | 2/2011 | Daniel |
| 2011/0023942 A1 | 2/2011 | Soegding |
| 2011/0023958 A1 | 2/2011 | Masson et al. |
| 2011/0030761 A1 | 2/2011 | Kalkanoglu |
| 2011/0030777 A1 | 2/2011 | Lim et al. |
| 2011/0036390 A1 | 2/2011 | Nelson et al. |
| 2011/0048491 A1 | 3/2011 | Taira |
| 2011/0056545 A1 | 3/2011 | Ji et al. |
| 2011/0073175 A1 | 3/2011 | Hilali et al. |
| 2011/0088762 A1 | 4/2011 | Singh et al. |
| 2011/0089079 A1 | 4/2011 | Lo |
| 2011/0120518 A1 | 5/2011 | Rust |
| 2011/0132426 A1 | 6/2011 | Kang et al. |
| 2011/0146759 A1 | 6/2011 | Lee et al. |
| 2011/0146781 A1 | 6/2011 | Laudisio et al. |
| 2011/0156188 A1 | 6/2011 | Tu et al. |
| 2011/0168250 A1 | 7/2011 | Lin et al. |
| 2011/0168261 A1 | 7/2011 | Weiser et al. |
| 2011/0174374 A1 | 7/2011 | Harder |
| 2011/0177648 A1 | 7/2011 | Tanner et al. |
| 2011/0186112 A1 | 8/2011 | Aernouts et al. |
| 2011/0197947 A1 | 8/2011 | Croft |
| 2011/0220182 A1 | 9/2011 | Lin et al. |
| 2011/0245957 A1 | 10/2011 | Porthouse et al. |
| 2011/0259419 A1 | 10/2011 | Hagemann et al. |
| 2011/0272012 A1 | 11/2011 | Heng et al. |
| 2011/0277688 A1 | 11/2011 | Trujillo et al. |
| 2011/0277816 A1 | 11/2011 | Xu et al. |
| 2011/0277825 A1 | 11/2011 | Fu |
| 2011/0284064 A1 | 11/2011 | Engelhart et al. |
| 2011/0297224 A1 | 12/2011 | Miyamoto et al. |
| 2011/0297227 A1 | 12/2011 | Pysch et al. |
| 2011/0300661 A1 | 12/2011 | Pearce et al. |
| 2011/0308573 A1 | 12/2011 | Jaus |
| 2012/0000502 A1 | 1/2012 | Wiedeman et al. |
| 2012/0012153 A1 | 1/2012 | Azechi et al. |
| 2012/0012162 A1 | 1/2012 | Kobayashi |
| 2012/0012174 A1 | 1/2012 | Wu |
| 2012/0028461 A1 | 2/2012 | Ritchie et al. |
| 2012/0031470 A1 | 2/2012 | Dimov |
| 2012/0031480 A1 | 2/2012 | Tisler |
| 2012/0040487 A1 | 2/2012 | Asthana et al. |
| 2012/0042924 A1 | 2/2012 | Lee |
| 2012/0042925 A1 | 2/2012 | Pfennig |
| 2012/0048349 A1* | 3/2012 | Metin ............... H01L 31/02013 |
| | | 136/251 |
| 2012/0060911 A1 | 3/2012 | Fu |
| 2012/0073975 A1 | 3/2012 | Ganti |
| 2012/0080083 A1 | 4/2012 | Liang et al. |
| 2012/0085384 A1 | 4/2012 | Beitel et al. |

(56) References Cited

U.S. PATENT DOCUMENTS

| | | |
|---|---|---|
| 2012/0103408 A1 | 5/2012 | Moslehi et al. |
| 2012/0122262 A1 | 5/2012 | Kang et al. |
| 2012/0125391 A1 | 5/2012 | Pinarbasi |
| 2012/0145233 A1 | 6/2012 | Syn et al. |
| 2012/0152349 A1 | 6/2012 | Cao et al. |
| 2012/0152752 A1 | 6/2012 | Keigler et al. |
| 2012/0167986 A1 | 7/2012 | Meakin et al. |
| 2012/0180851 A1 | 7/2012 | Nagel |
| 2012/0192932 A1 | 8/2012 | Wu et al. |
| 2012/0199184 A1 | 8/2012 | Hui |
| 2012/0237670 A1 | 9/2012 | Lim |
| 2012/0240995 A1 | 9/2012 | Coakley |
| 2012/0248497 A1 | 10/2012 | Zhou et al. |
| 2012/0279443 A1 | 11/2012 | Kommeyer |
| 2012/0279548 A1 | 11/2012 | Munch et al. |
| 2012/0285517 A1 | 11/2012 | Souza et al. |
| 2012/0305060 A1 | 12/2012 | Fu et al. |
| 2012/0318319 A1 | 12/2012 | Pinarbasi et al. |
| 2012/0318340 A1 | 12/2012 | Heng et al. |
| 2012/0319253 A1 | 12/2012 | Mizuno |
| 2012/0325282 A1 | 12/2012 | Snow et al. |
| 2013/0000705 A1 | 1/2013 | Shappir |
| 2013/0000715 A1 | 1/2013 | Moslehi et al. |
| 2013/0014802 A1 | 1/2013 | Zimmerman |
| 2013/0019919 A1 | 1/2013 | Hoang et al. |
| 2013/0048062 A1 | 2/2013 | Min |
| 2013/0056051 A1 | 3/2013 | Jin et al. |
| 2013/0061913 A1 | 3/2013 | Willham |
| 2013/0094124 A1 | 4/2013 | Yang |
| 2013/0096710 A1 | 4/2013 | Pinarbasi et al. |
| 2013/0112239 A1 | 5/2013 | Liptac et al. |
| 2013/0130430 A1 | 5/2013 | Moslehi et al. |
| 2013/0139878 A1 | 6/2013 | Bhatnagar et al. |
| 2013/0152996 A1 | 6/2013 | Degroot et al. |
| 2013/0160823 A1 | 6/2013 | Khouri |
| 2013/0160826 A1 | 6/2013 | Beckerman et al. |
| 2013/0174897 A1 | 7/2013 | You et al. |
| 2013/0199608 A1 | 8/2013 | Emeraud |
| 2013/0206213 A1 | 8/2013 | He |
| 2013/0206219 A1 | 8/2013 | Kurtin et al. |
| 2013/0206221 A1 | 8/2013 | Gannon et al. |
| 2013/0209776 A1 | 8/2013 | Kim |
| 2013/0213469 A1 | 8/2013 | Kramer et al. |
| 2013/0220401 A1 | 8/2013 | Scheulov |
| 2013/0228221 A1 | 9/2013 | Moslehi et al. |
| 2013/0233378 A1 | 9/2013 | Moslehi |
| 2013/0239891 A1 | 9/2013 | Hashimoto et al. |
| 2013/0247955 A1 | 9/2013 | Baba |
| 2013/0247959 A1 | 9/2013 | Kwon |
| 2013/0255755 A1 | 10/2013 | Chich |
| 2013/0269771 A1 | 10/2013 | Kim et al. |
| 2013/0280521 A1 | 10/2013 | Mori |
| 2013/0291743 A1 | 11/2013 | Endo et al. |
| 2013/0306128 A1 | 11/2013 | Kannou et al. |
| 2014/0000682 A1 | 1/2014 | Zhao |
| 2014/0053899 A1 | 2/2014 | Haag et al. |
| 2014/0060621 A1 | 3/2014 | Clark et al. |
| 2014/0066265 A1 | 3/2014 | Oliver |
| 2014/0096823 A1 | 4/2014 | Fu et al. |
| 2014/0102502 A1 | 4/2014 | Luch et al. |
| 2014/0102524 A1 | 4/2014 | Xie et al. |
| 2014/0120699 A1 | 5/2014 | Hua |
| 2014/0124013 A1 | 5/2014 | Morad et al. |
| 2014/0124014 A1* | 5/2014 | Morad ............... H01L 31/0392 |
| | | 136/246 |
| 2014/0154836 A1 | 6/2014 | Kim et al. |
| 2014/0196768 A1 | 7/2014 | Heng et al. |
| 2014/0242746 A1 | 8/2014 | Albadri et al. |
| 2014/0261624 A1 | 9/2014 | Cruz-Campa et al. |
| 2014/0261654 A1 | 9/2014 | Babayan et al. |
| 2014/0261661 A1 | 9/2014 | Babayan et al. |
| 2014/0262793 A1 | 9/2014 | Babayan et al. |
| 2014/0273338 A1 | 9/2014 | Kumar et al. |
| 2014/0284750 A1 | 9/2014 | Yu et al. |
| 2014/0299187 A1 | 10/2014 | Chang et al. |
| 2014/0313574 A1 | 10/2014 | Bills |
| 2014/0318611 A1 | 10/2014 | Moslehi et al. |
| 2014/0345674 A1 | 11/2014 | Yang et al. |
| 2014/0349441 A1 | 11/2014 | Fu et al. |
| 2014/0352777 A1 | 12/2014 | Hachtmann et al. |
| 2014/0360582 A1 | 12/2014 | Cui |
| 2015/0007879 A1 | 1/2015 | Kwon et al. |
| 2015/0020877 A1 | 1/2015 | Moslehi et al. |
| 2015/0075599 A1 | 3/2015 | Yu et al. |
| 2015/0090314 A1 | 4/2015 | Yang |
| 2015/0096613 A1 | 4/2015 | Tjahjono et al. |
| 2015/0114444 A1 | 4/2015 | Lentine et al. |
| 2015/0129024 A1 | 5/2015 | Brainard et al. |
| 2015/0144180 A1 | 5/2015 | Baccini et al. |
| 2015/0155824 A1 | 6/2015 | Chien |
| 2015/0171230 A1 | 6/2015 | Kapur et al. |
| 2015/0194552 A1 | 7/2015 | Ogasahara |
| 2015/0206997 A1 | 7/2015 | Fidaner et al. |
| 2015/0207011 A1 | 7/2015 | Garnett et al. |
| 2015/0214409 A1 | 7/2015 | Pfeiffer et al. |
| 2015/0236177 A1 | 8/2015 | Fu et al. |
| 2015/0243931 A1 | 8/2015 | Fukuura |
| 2015/0270410 A1 | 9/2015 | Heng |
| 2015/0280641 A1 | 10/2015 | Garg et al. |
| 2015/0325731 A1 | 11/2015 | Namjoshi et al. |
| 2015/0333199 A1 | 11/2015 | Kim et al. |
| 2015/0340531 A1 | 11/2015 | Hayashi et al. |
| 2015/0349145 A1 | 12/2015 | Morad |
| 2015/0349152 A1 | 12/2015 | Voss |
| 2015/0349153 A1 | 12/2015 | Morad et al. |
| 2015/0349161 A1 | 12/2015 | Morad et al. |
| 2015/0349162 A1 | 12/2015 | Morad et al. |
| 2015/0349167 A1 | 12/2015 | Morad et al. |
| 2015/0349168 A1 | 12/2015 | Morad et al. |
| 2015/0349169 A1 | 12/2015 | Morad et al. |
| 2015/0349170 A1 | 12/2015 | Morad et al. |
| 2015/0349171 A1 | 12/2015 | Morad et al. |
| 2015/0349172 A1 | 12/2015 | Morad et al. |
| 2015/0349173 A1 | 12/2015 | Morad et al. |
| 2015/0349174 A1 | 12/2015 | Morad et al. |
| 2015/0349175 A1 | 12/2015 | Morad et al. |
| 2015/0349176 A1 | 12/2015 | Morad et al. |
| 2015/0349190 A1 | 12/2015 | Tjahjono et al. |
| 2015/0349193 A1 | 12/2015 | Morad et al. |
| 2015/0349701 A1 | 12/2015 | Morad et al. |
| 2015/0349702 A1 | 12/2015 | Morad et al. |
| 2015/0349703 A1 | 12/2015 | Morad |
| 2016/0013329 A1 | 1/2016 | Brophy |
| 2016/0105144 A1 | 4/2016 | Haynes |
| 2016/0163888 A1 | 6/2016 | Reddy |
| 2016/0163902 A1 | 6/2016 | Podlowski |
| 2016/0181446 A1 | 6/2016 | Kalkanoglu |
| 2016/0190354 A1 | 6/2016 | Agrawal et al. |
| 2016/0204289 A1 | 7/2016 | Tao et al. |
| 2016/0225931 A1 | 8/2016 | Heng |
| 2016/0233353 A1 | 8/2016 | Tamura et al. |
| 2016/0268963 A1 | 9/2016 | Tsai et al. |
| 2016/0322513 A1 | 11/2016 | Martin et al. |
| 2016/0329443 A1 | 11/2016 | Wang et al. |
| 2017/0033250 A1 | 2/2017 | Ballif |
| 2017/0077343 A1* | 3/2017 | Morad ............... H01L 31/0201 |
| 2017/0084766 A1 | 3/2017 | Yang et al. |
| 2017/0162722 A1 | 6/2017 | Fu et al. |
| 2017/0170336 A1 | 6/2017 | Yang et al. |
| 2017/0194516 A1 | 7/2017 | Reddy |
| 2017/0222082 A1 | 8/2017 | Lin |
| 2017/0288081 A1 | 10/2017 | Babayan et al. |
| 2017/0373204 A1 | 12/2017 | Corneille et al. |
| 2017/0373211 A1* | 12/2017 | Murali ............... H01L 31/0508 |
| 2018/0122964 A1 | 5/2018 | Adachi et al. |
| 2018/0158970 A1 | 6/2018 | Yoon et al. |
| 2018/0166601 A1* | 6/2018 | Inaba ............... H01L 31/0508 |
| 2018/0198008 A1 | 7/2018 | Tripp et al. |
| 2019/0292418 A1 | 9/2019 | Xiang et al. |

FOREIGN PATENT DOCUMENTS

| | | |
|---|---|---|
| CN | 101233620 A | 7/2008 |
| CN | 101305454 A | 11/2008 |

(56) References Cited

FOREIGN PATENT DOCUMENTS

| | | |
|---|---|---|
| CN | 101553933 A | 10/2009 |
| CN | 100580957 C | 1/2010 |
| CN | 102088040 A | 6/2011 |
| CN | 102263157 A | 11/2011 |
| CN | 104205347 A | 12/2014 |
| CN | 104409402 A | 3/2015 |
| CN | 102544380 | 8/2015 |
| CN | 103426957 | 3/2016 |
| CN | 102956730 | 6/2016 |
| DE | 4030713 A1 | 4/1992 |
| DE | 102006009194 A1 | 8/2007 |
| DE | 202007002897 U1 | 7/2008 |
| DE | 102007054124 | 5/2009 |
| DE | 102008045522 A1 | 3/2010 |
| DE | 102010061317 A1 | 6/2012 |
| DE | 102012010151 A1 | 11/2013 |
| EP | 1058320 | 12/2000 |
| EP | 1770791 A1 | 4/2007 |
| EP | 1816684 A2 | 8/2007 |
| EP | 2051124 A2 | 4/2009 |
| EP | 2071635 A2 | 6/2009 |
| EP | 2113946 A2 | 11/2009 |
| EP | 2362430 A1 | 8/2011 |
| EP | 2385561 A2 | 11/2011 |
| EP | 2387079 A2 | 11/2011 |
| EP | 2479796 A1 | 7/2012 |
| EP | 2709160 | 3/2014 |
| EP | 2626907 B1 | 8/2014 |
| GB | 2278618 | 12/1994 |
| JP | 57-89269 A | 6/1982 |
| JP | S57141979 | 9/1982 |
| JP | S6020586 | 2/1985 |
| JP | 4-245683 A | 9/1992 |
| JP | H06140657 | 5/1994 |
| JP | 6-196766 A | 7/1994 |
| JP | H06246571 | 9/1994 |
| JP | 7-249788 A | 9/1995 |
| JP | 10-4204 A | 1/1998 |
| JP | 11-31834 A | 2/1999 |
| JP | 2000091610 | 3/2000 |
| JP | 2000-164902 A | 6/2000 |
| JP | 2000216415 | 8/2000 |
| JP | 2002-57357 A | 2/2002 |
| JP | 2005-159312 A | 6/2005 |
| JP | 2006-523025 A | 10/2006 |
| JP | 2006-324504 A | 11/2006 |
| JP | 2007-123792 A | 5/2007 |
| JP | 2008-135655 A | 6/2008 |
| JP | 2009-54748 A | 3/2009 |
| JP | 2009-177225 A | 8/2009 |
| JP | 2011-181966 A | 9/2011 |
| JP | 2012-119393 A | 6/2012 |
| JP | 2013-526045 A | 6/2013 |
| JP | 2013-161855 A | 8/2013 |
| JP | 2013-536512 A | 9/2013 |
| JP | 2013-537000 A | 9/2013 |
| JP | 2013-219378 A | 10/2013 |
| JP | 2013211385 | 10/2013 |
| JP | 2013-233553 A | 11/2013 |
| JP | 2013-239694 A | 11/2013 |
| JP | 2013-247231 A | 12/2013 |
| KR | 10-2005-0122721 A | 12/2005 |
| KR | 10-2006-0003277 A | 1/2006 |
| KR | 10-2009-0011519 A | 2/2009 |
| WO | 1991/17839 A1 | 11/1991 |
| WO | 1991/20097 A1 | 12/1991 |
| WO | 2003/083953 A1 | 10/2003 |
| WO | 2006/097189 A1 | 9/2006 |
| WO | 2008/089657 A1 | 7/2008 |
| WO | 2008136872 | 11/2008 |
| WO | 2009062106 | 5/2009 |
| WO | 2009/094578 A2 | 7/2009 |
| WO | 2009099418 | 8/2009 |
| WO | 2009/150654 A2 | 12/2009 |
| WO | 2010/070015 A1 | 6/2010 |
| WO | 2010/075606 A1 | 7/2010 |
| WO | 2010/085949 A2 | 8/2010 |
| WO | 2010/104726 A2 | 9/2010 |
| WO | 2010/123974 A1 | 10/2010 |
| WO | 2010128375 | 11/2010 |
| WO | 2011/005447 A2 | 1/2011 |
| WO | 2011/008881 A2 | 1/2011 |
| WO | 2011/053006 A2 | 5/2011 |
| WO | 2011/123646 A2 | 10/2011 |
| WO | 2011128757 | 10/2011 |
| WO | 2013/020590 A1 | 2/2013 |
| WO | 2013/046351 A1 | 4/2013 |
| WO | 201359441 | 4/2013 |
| WO | 2013067541 | 5/2013 |
| WO | 2013102181 | 7/2013 |
| WO | 2014/066265 A1 | 5/2014 |
| WO | 2014/074826 A2 | 5/2014 |
| WO | 2014/110520 A1 | 7/2014 |
| WO | 2014/117138 A1 | 7/2014 |
| WO | 2014178180 | 11/2014 |
| WO | 2015155356 | 10/2015 |
| WO | 2015/183827 A2 | 12/2015 |
| WO | 2015/195283 A1 | 12/2015 |
| WO | 2016/090332 A1 | 6/2016 |
| WO | 2016090341 | 6/2016 |

OTHER PUBLICATIONS

Bulucani et al., "A new approach: low cost masking material and efficient copper metallization for higher efficiency silicon solar cells" 2015 IEEE.

Fan et al., "Laser micromachined wax-covered plastic paper as both sputter deposition shadow masks and deep-ultraviolet patterning masks for polymethylmacrylate-based microfluidic systems" via google scholar, downloaded Mar. 31, 2016.

"An inorganic/organic hybrid coating for low cost metal mounted dye-sensitized solar cells" Vyas, N. et al.

"Recovery Act: Organic Coatings as Encapsulants for Low Cost, High Performance PV Modules" Jim Poole et al. Nov. 16, 2011.

Advisory Action received for U.S. Appl. No. 14/985,338, dated Aug. 25, 2017, 3 pages.

Beaucarne et al., "Epitaxial Thin-Film Si Solar Cells", Thin Solid Films, Elsevier, vol. 511-512, Jul. 26, 2006, pp. 533-542.

Borden et al., "Polysilicon Tunnel Junctions as Alternates to Diffused Junctions", Proceedings of the 23rd European Photovoltaic Solar Energy Conference, Sep. 1-5, 2008, pp. 1149-1152.

Chabal et al., "Silicon Surface and Interface Issues for Nanoelectronics", The Electrochemical Society Interface, Spring 2005, 2005, pp. 31-33.

Collins English Dictionary, In Collins English Dictionary, Online Available at <http://search.credoreference.com/content/entry/hcengdict/convex/0>, Oct. 18, 2014, 2 pages.

Cui et al., "Indium Tin Oxide Alternatives—High Work Function Transparent Conducting Oxides as Anodes for Organic Light-Emitting Diodes" Advanced Materials, col. 13, 2001, pp. 1476-1480.

Cui, "Chapter 7 Dopant diffusion", Online Available at:-<https://web.archive.org/~eb/20101104143332/http://ece.uwaterloo.ca/-bcui/content/NE/%20343/Chapter/%207%20Dopant%20 diffusion%20_%201.pptx>, Nov. 4, 2010, 28 pages.

Davies P.C.W., "Quantum Tunneling Time", American Journal of Physics, Issue 73, No. 1, Jan. 2005, pp. 23-27.

Dosaj et al., "Single Crystal Silicon Ingot Pulled from Chemically-upgraded Metallurgical-grade Silicon", Conference Record Of The IEEE Photovoltaic Specialists Conference, May 6, 1975, pp. 275-279.

"Electrically Conductive Foil Tape for Bus Bar Components in Photovoltaic Modules, Adhesives Research, Healthcare Electronics Industrial Splicing Release Technologies Capabilities Conta Liners", Online Available at: <http://www.adhesivesresearch.com/electrically-conductive-foiltape-for-bus-bar-components-in-photovoltaic-modules/>, 2017, 2 pages.

Final Office Action received for U.S. Appl. No. 14/985,338, dated Mar. 30, 2017, 20 pages.

(56) References Cited

OTHER PUBLICATIONS

Final Office Action received for U.S. Appl. No. 14/985,338, dated Sep. 26, 2019, 16 pages.
Final Office Action received for U.S. Appl. No. 15/400,874, dated Oct. 24, 2019, 20 pages.
First Action Interview—Office Action received for U.S. Appl. No. 15/400,874, dated Jun. 6, 2019, 10 pages.
First Action Interview—Office Action received for U.S. Appl. No. 14/985,338, dated Nov. 4, 2016, 9 pages.
Geissbuhler et al., "Silicon Heterojunction solar Cells with Copper-Plated Grid Electrodes: Status and Comparison with Silver Thick-Film Techniques", IEEE Journal of Photovoltaics, vol. 4, No. 4,, Jul. 2014, pp. 1055-1062.
Green et al., "High-Efficiency Silicon Solar Cells", IEEE Transactions on Electron Devices, vol. ED-31, No. 5, May 1984, pp. 679-683.
Hamm et al., "Development of a Plated Nickel Seed Layer for Front Side Metallization of Silicon Solar Cells", 24th European Photovoltaic Solar Energy Conference, Sep. 2009.
Hornbachner et al., "Cambered Photovoltaic Module and Method for its Manufacture", Jun. 17, 2009.
Kanani Nasser, "Coating Thickness and its Measurement", Electroplating: Basic Principles, Processes and Practice, Chapter 8, 2004, pp. 247-291.
Khattak et al., "Refining Molten Metallurgical Grade Silicon for use as Feedstock for Photovoltaic Applications", 16th European Photovoltaic Solar Energy Conference, May 1-5, 2000, pp. 1282-1285.
Korte et al., "Overview on A-Se:H/C Heterojunction Solar Cells—Physics and Technology", Proceedings of the 22nd European Photovoltaic Solar Energy Conference, Sep. 3-7, 2007, pp. 859-865.
Leroy et al., "In Search for the Limits of Rotating Cylindrical Magnetron Sputtering", Magnetron, ION Processing and ARC Technologies European Conference, 2010, pp. 1-32.
Li, "Surface and Bulk Passsivation of Multicrystalline Silicon Solar Cells By Silicon Nitride (H) Layer: Modeling and Experiments", Ph.D. dissertation, N.J. Inst. of Tech., Jan. 2009, 131 pages.
"Mesh", Merriam-Webster online dictionary, Oct. 8, 2012, 5 pages.
Meyerson et al., "Nonequilibrium boron doping effects in low-temperature epitaxial silicon", Applied Physics Letters, Issue 50, No. 2,, 1987, p. 113-115.
Mueller et al., "Application of Wide-Band Gap Hydrogenated Amorphous Silicon Oxide Layers to Heterojunction Solar Cells for High Quality Passivation", Photovoltaic Specialists Conference, PVSC'08. 33rd IEEE, 2008, 6 pages.
Mueller et al., "High Quality Passivation for Heterojunction Solar Cells by Hydrogenated Amorphous Silicon Suboxide Films", Applied Physics Letters 92.3, 2008, 6 pages.
Munzer et al., "High Throughput Industrial In-Line Boron BSF Diffusion", 20th European Photovoltaic Solar Energy Conference, Jun. 2005, pp. 777-780.
Non-Final Office Action received for U.S. Appl. No. 14/985,338, dated Jan. 31, 2019, 18 pages.
O'Mara et al., "Handbook of Semiconductor Silicon Technology", William Andrew Publishing/Noyes, 1990, pp. 275-293.
Parthavi, "Doping by Diffusion and Implantation", Apr. 26, 2018, 50 pages.
Pires et al., "The Purification of Metallurgical Grade Silicon by Electron Beam Melting", Journal of Materials Processing Technology, Issue 169, 2005, pp. 16-20.
Pre-Interview First Office Action received for U.S. Appl. No. 14/985,338, dated Apr. 22, 2016, 6 pages.
Pre-Interview First Office Action received for U.S. Appl. No. 15/400,874, dated Feb. 14, 2019, 12 pages.
Roedern et al., "Why is the Open-Circuit Voltage of Crystalline Si Solar Cells so Critically Dependent on Emitter-and Base-Doping?", Presented at the 9th Workshop on Crystalline Silicon Solar Cell Materials and Processes, Aug. 9-11, 1999, 7 pages.
Stangl et al., "Amorphous/Crystalline Silicon heterojunction solar cells—a simulation study", 17th European Photovoltaic Conference, Oct. 2001, 4 pages.
Tomasi et al., "Back-Contacted Silicon Heterojunction Solar Cells With Efficiency>21 %", IEEE Journal of Photovoltaics, vol. 4, No. 4, Jul. 2014, pp. 1046-1053.
Warabisako et al., "Efficient Solar Cells From Metallurgical-grade Silicon", Proceedings of the 11th Conference, Japan Society Of Applied Physics, vol. 19, No. 1980, Supplemental 19-01, 1979, pp. 539-544.
Weiss et al., "Development of Different Copper Seed Layers with Respect to the Copper Electroplating Process", Microelectronic Engineering, Issue 50,, Mar. 15, 2000, pp. 443-440.
Yao et al., "The p Recombination Layer in Tunnel Junctions for Micromorph Tandem Solar Cells", Interdisciplinary Physics And Related Areas Of Science And Technology, vol. 20, No. 7,, 2011, pp. 078402-1-078402-5.
Zhao et al., "24% Efficient Perl Silicon Solar Cell: Recent Improvements in High Efficiency Silicon Cell Research", Solar Energy Materials and Solar Cells, Issue 41/42, 1996, pp. 87-99.
"Weather Forecast Office Louiseville", National Weather Service, Online Available at:-<https://www.weather.gov/lmk/?n=seasons>, Apr. 29, 2015, 1 page.

* cited by examiner

PARALLEL-CONNECTED SOLAR ROOF TILE MODULES

BACKGROUND

Field

This disclosure is generally related to photovoltaic (or "PV") roof modules. More specifically, this disclosure is related to a multi-tile module that includes multiple PV roof tiles connected in parallel.

Related Art

In residential and commercial solar energy installations, a building's roof typically is installed with photovoltaic (PV) modules, also called PV or solar panels, that can include a two-dimensional array (e.g., 6×12) of solar cells. A PV roof tile (or solar roof tile) can be a particular type of PV module offering weather protection for the home and a pleasing aesthetic appearance, while also functioning as a PV module to convert solar energy to electricity. The PV roof tile can be shaped like a conventional roof tile and can include one or more solar cells encapsulated between a front cover and a back cover, but typically enclose fewer solar cells than a conventional solar panel. The front and back covers can be fortified glass or other material that can protect the PV cells from the weather elements. Note that a typical roof tile may have a dimension of 15 in×8 in$^2$=120 in$^2$=774 cm$^2$, and a typical solar cell may have a dimension of 6 in×6 in=36 in$^2$=232 cm$^2$. Similar to a conventional PV panel, the PV roof tile can include an encapsulating layer, such as an organic polymer. A lamination process can seal the solar cells between the front and back covers.

To facilitate scalable production and easy installation of PV roof tiles, a group of tiles can be fabricated together as a single module. Like conventional PV panels, electrical interconnections are needed within each multi-tile module.

SUMMARY

One embodiment can provide a photovoltaic roof module. The photovoltaic roof module can include a plurality of photovoltaic roof tiles positioned side by side. A respective solar roof tile comprises a plurality of photovoltaic structures positioned between a front cover and a back cover, and the photovoltaic structures are electrically coupled to each other in series. The photovoltaic roof tiles are electrically coupled to each other in parallel.

In a variation on this embodiment, a respective photovoltaic structure can include a first edge busbar positioned near an edge of a first surface and a second edge busbar positioned near an opposite edge of a second surface, and the plurality of photovoltaic structures can be arranged in such a way that the first edge busbar of a first photovoltaic structure overlaps the second edge busbar of an adjacent photovoltaic structure, thereby forming a cascaded string.

In a further variation, the photovoltaic roof tiles can be electrically coupled to each other via metallic tabs, and a respective metallic tab can be coupled to an edge busbar at an edge of the cascaded string.

In a further variation, the metallic tab can be electrically coupled to the edge busbar of the cascaded string via a strain-relief connector.

In a further variation, the strain-relief connector can include an elongated connection member, a number of curved metal wires, laterally extended from one side of the elongated connection member, and a number of connection pads.

In a further variation, the strain-relief connector can be attached to the edge busbar and the metallic tab via electrically conductive adhesive.

In a variation on this embodiment, a respective photovoltaic structure can be obtained by dividing a square or pseudo-square solar cell into three pieces.

In a further variation, the respective photovoltaic roof tile can include six serially coupled photovoltaic structures, and the photovoltaic roof module can include three photovoltaic roof tiles.

In a variation on this embodiment, the photovoltaic roof module can further include a pair of junction boxes for facilitating electrical coupling between the photovoltaic roof tile module and an adjacent photovoltaic roof tile module. A junction box is mounted on the back cover of a particular photovoltaic roof tile.

In a further variation, the junction box can include an attachment pad configured to electrically access photovoltaic structures encapsulated inside the particular photovoltaic roof tile via a through hole on the back cover of the particular photovoltaic roof tile, and a lead wire electrically coupled to the attachment pad. At least a portion of the lead wire is protected by a weatherproof jacket.

One embodiment can provide a method for fabricating a photovoltaic roof module. The method can include obtaining a plurality of cascaded strings of photovoltaic structures, with photovoltaic structures included in each cascaded string being electrically coupled to each other in series. The method can further include electrically coupling the plurality of cascaded strings to each other in parallel and laminating the cascaded strings between front and back covers of corresponding photovoltaic roof tiles, one cascaded string per photovoltaic roof tile.

A "solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "solar cell strip," "photovoltaic strip," "smaller cell," or "strip" is a portion or segment of a photovoltaic structure, such as a solar cell. A photovoltaic structure may be divided into a number of strips. A strip may have any shape and any size. The width and length of a strip may be the same or different from each other. Strips may be formed by further dividing a previously divided strip.

"Finger lines," "finger electrodes," and "fingers" refer to elongated, electrically conductive (e.g., metallic) electrodes of a photovoltaic structure for collecting carriers.

"Busbar," "bus line," or "bus electrode" refer to elongated, electrically conductive (e.g., metallic) electrodes of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

A "photovoltaic structure" can refer to a solar cell, a segment, or a solar cell strip. A photovoltaic structure is not limited to a device fabricated by a particular method. For example, a photovoltaic structure can be a crystalline silicon-based solar cell, a thin film solar cell, an amorphous silicon-based solar cell, a polycrystalline silicon-based solar cell, or a strip thereof.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the disclosed system is not limited to the embodiments shown, but is to be accorded the widest scope consistent with the principles and features disclosed herein.

Overview

Embodiments of the disclosed system solve the technical problem of interconnecting multiple photovoltaic (PV) roof tiles within a multi-tile module. More specifically, each solar roof tile can include a plurality of photovoltaic strips, which can be obtained by dividing conventional square solar cells into multiple pieces. The photovoltaic strips within each solar roof tile can form a serially connected string, resulting in the output voltage of each string being multiples of that of the conventional square solar cell and the output current being a fraction of the conventional square cell. Parallel coupling among different PV tiles within a multi-tile module can lower the internal resistance of the multi-tile module, and keep the output voltage and current at a reasonable level. In some embodiments, each strip can be obtained by dividing a square solar cell into three pieces, each tile can include six serially coupled strips, and each multi-tile module can include three PV tiles that are coupled to each other in parallel.

Solar Roof Tiles and Multi-Tile Modules

Prefabricating individual PV tiles into multi-tile modules can considerably simplify the roofing process, since the tiles within the module have been electrically and mechanically connected at the time of manufacture. However, carelessly designed electrical interconnections within the multi-tile modules can result in modules with undesirably high output voltages and/or low output currents. The disclosed system and methods may provide a photovoltaic (PV) module containing multiple PV rooftop tiles with output voltage and current suitable for enabling robust design of solar roofs.

A PV roof tile (or solar roof tile) is a type of PV module shaped like a roof tile and typically enclosing fewer solar cells than a conventional solar panel. Note that such PV roof tiles can function as both PV cells and roof tiles at the same time. PV roof tiles and modules are described in more detail in U.S. Provisional Patent Application No. 62/465,694, entitled "SYSTEM AND METHOD FOR PACKAGING PHOTOVOLTAIC ROOF TILES" filed Mar. 1, 2017, which is incorporated herein by reference. In some embodiments, the system disclosed herein can be applied to PV roof tiles and/or other types of PV module.

Figure 1:
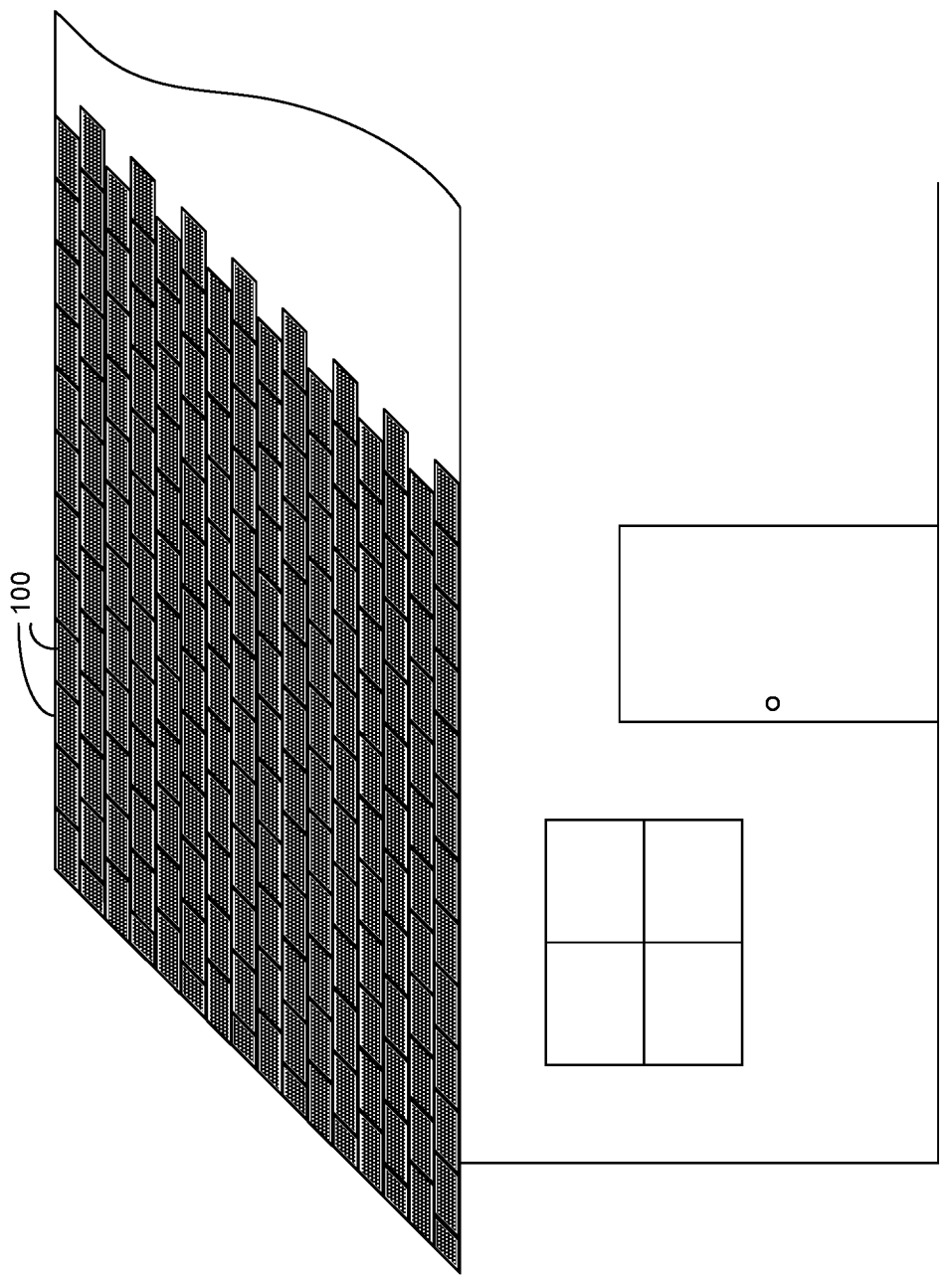
FIG. 1 shows an exemplary configuration of PV roof tiles on a house.

FIG. 1 shows an exemplary configuration of PV roof tiles on a house. PV roof tiles 100 can be installed on a house like conventional roof tiles or shingles. Particularly, a PV roof tile can be placed with other tiles in such a way as to prevent water from entering the building.

A PV roof tile can enclose multiple solar cells or PV structures, and a respective PV structure can include one or more electrodes such as busbars and finger lines. The PV structures within a PV roof tile can be electrically and optionally mechanically coupled to each other. For example, multiple PV structures can be electrically coupled together by a metallic tab, via their respective busbars, to create serial or parallel connections. Moreover, electrical connections can be made between two adjacent tiles, so that a number of PV roof tiles can jointly provide electrical power.

Figure 2:
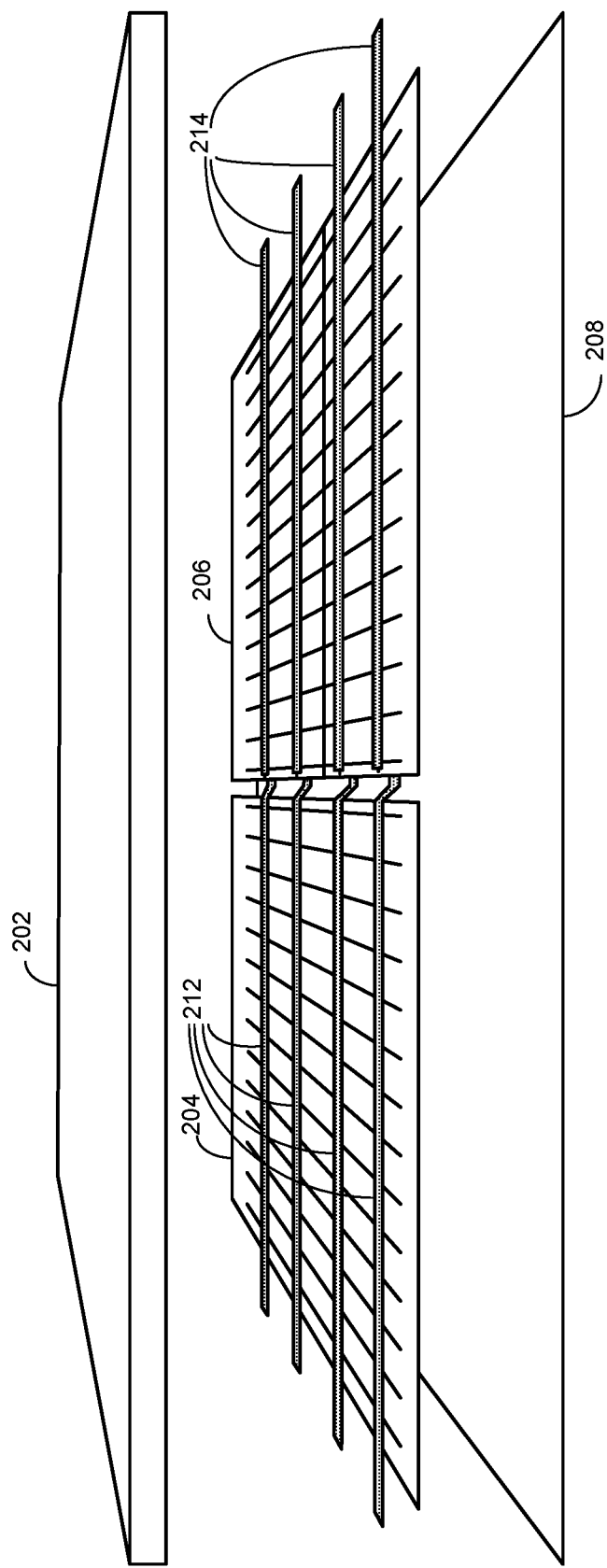
FIG. 2 shows the perspective view of an exemplary photovoltaic roof tile, according to an embodiment.

FIG. 2 shows the perspective view of an exemplary photovoltaic roof tile, according to an embodiment. Solar cells 204 and 206 can be hermetically sealed between top glass cover 202 and backsheet 208, which jointly can protect the solar cells from various weather elements. In the example shown in FIG. 2, metallic tabbing strips 212 can be in contact with the front-side electrodes of solar cell 204 and extend beyond the left edge of glass 202, thereby serving as contact electrodes of a first polarity of the PV roof tile. Tabbing strips 212 can also be in contact with the back side of solar cell 206, creating a serial connection between solar cell 204 and solar cell 206. On the other hand, tabbing strips 214 can be in contact with front-side electrodes of solar cell 206 and extend beyond the right edge of glass cover 202, serving as contact electrodes of a second polarity of the PV roof tile.

Figure 3:
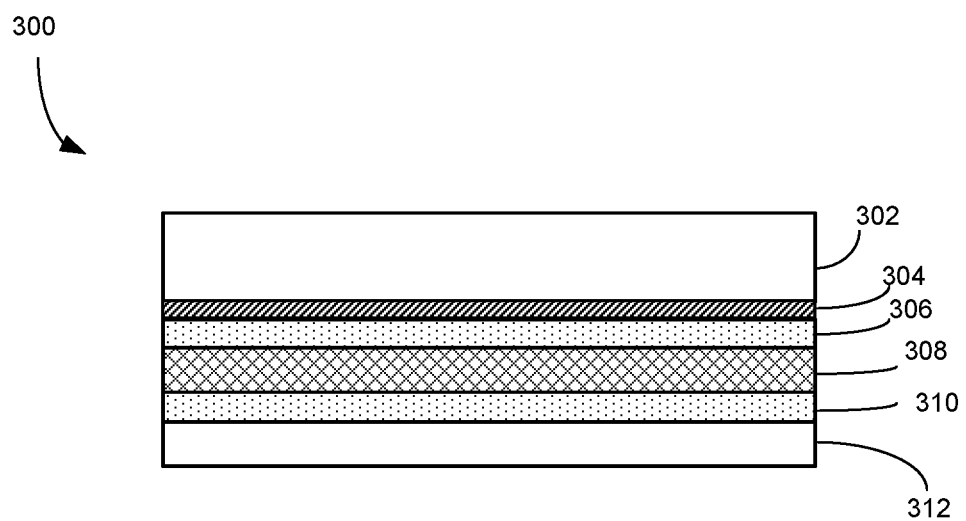
FIG. 3 shows a cross-section of an exemplary photovoltaic roof tile, according to an embodiment.

FIG. 3 shows a cross-section of an exemplary photovoltaic roof tile, according to an embodiment. Solar cell or array of solar cells 308 can be encapsulated between top glass cover 302 and back cover 312, which can be fortified glass or a regular PV backsheet. Top encapsulant layer 306, which can be based on a polymer, can be used to seal top glass cover 302 and solar cell or array of solar cells 308. Specifically, encapsulant layer 306 may include polyvinyl butyral (PVB), thermoplastic polyolefin (TPO), ethylene vinyl acetate (EVA), or N,N'-diphenyl-N,N'-bis(3-methylphenyl)-1,1'-diphenyl-4,4'-diamine (TPD). Similarly, lower encapsulant layer 310, which can be based on a similar material, can be used to seal array of solar cells 308 and back cover 312. A PV roof tile can also contain other optional layers, such as an optical filter or coating layer or a layer of nanoparticles for providing desired color appearances. In the example of FIG. 3, module or roof tile 300 also contains an optical filter layer 304.

Figure 4A:
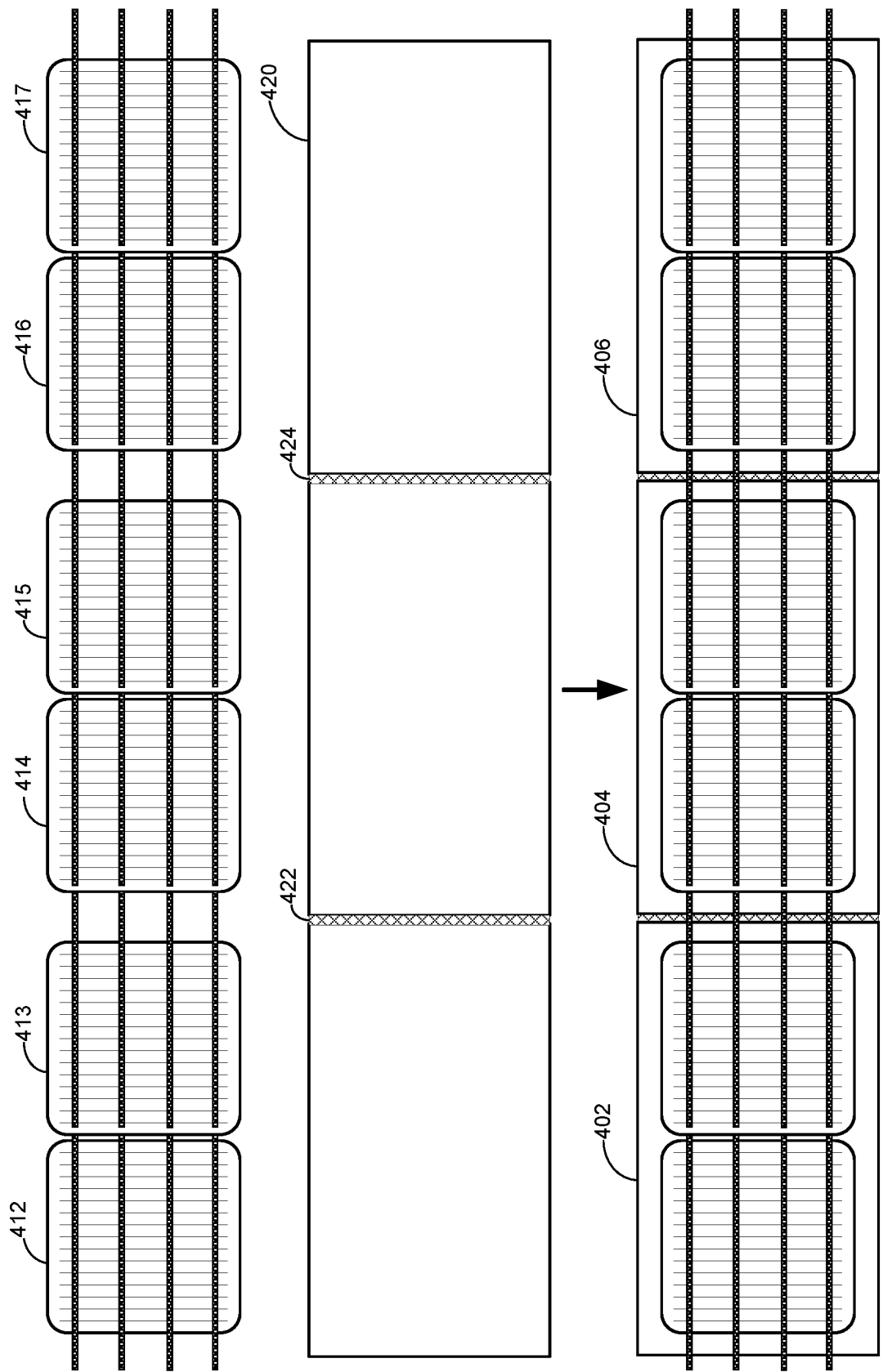
FIG. 4A illustrates an exemplary configuration of a multi-tile module, according to one embodiment.

To facilitate more scalable production and easier installation, multiple photovoltaic roof tiles can be fabricated together, while the tiles are linked in a rigid or semi-rigid way. FIG. 4A illustrates an exemplary configuration of a multi-tile module, according to one embodiment. In this example, three PV roof tiles 402, 404, and 406 can be manufactured together. During fabrication, solar cells 412 and 413 (corresponding to tile 402), 414 and 415 (corresponding to tile 404), and 416 and 417 (corresponding to tile 406) can be laid out with tabbing strips interconnecting their corresponding busbars, forming a connection in series. Furthermore, these six solar cells can be laid out on a common backsheet. Subsequently, front-side glass cover 420 can be sealed onto these six PV cells.

It is possible to use a single piece of glass as glass cover 420. In one embodiment, grooves 422 and 424 can be made on glass cover 420, so that the appearance of three separate roof tiles can be achieved. It is also possible to use three separate pieces of glass to cover the six cells, which are laid out on a common backsheet. In this case, gaps 422 and 424 can be sealed with an encapsulant material, establishing a semi-rigid coupling between adjacent tiles. Prefabricating multiple tiles into a rigid or semi-rigid multi-tile module can significantly reduce the complexity in roof installation, because the tiles within the module have been connected with the tabbing strips. Note that the numbers of tiles included in each multi-tile module can be more or fewer than what is shown in FIG. 4A.

Figure 4B:
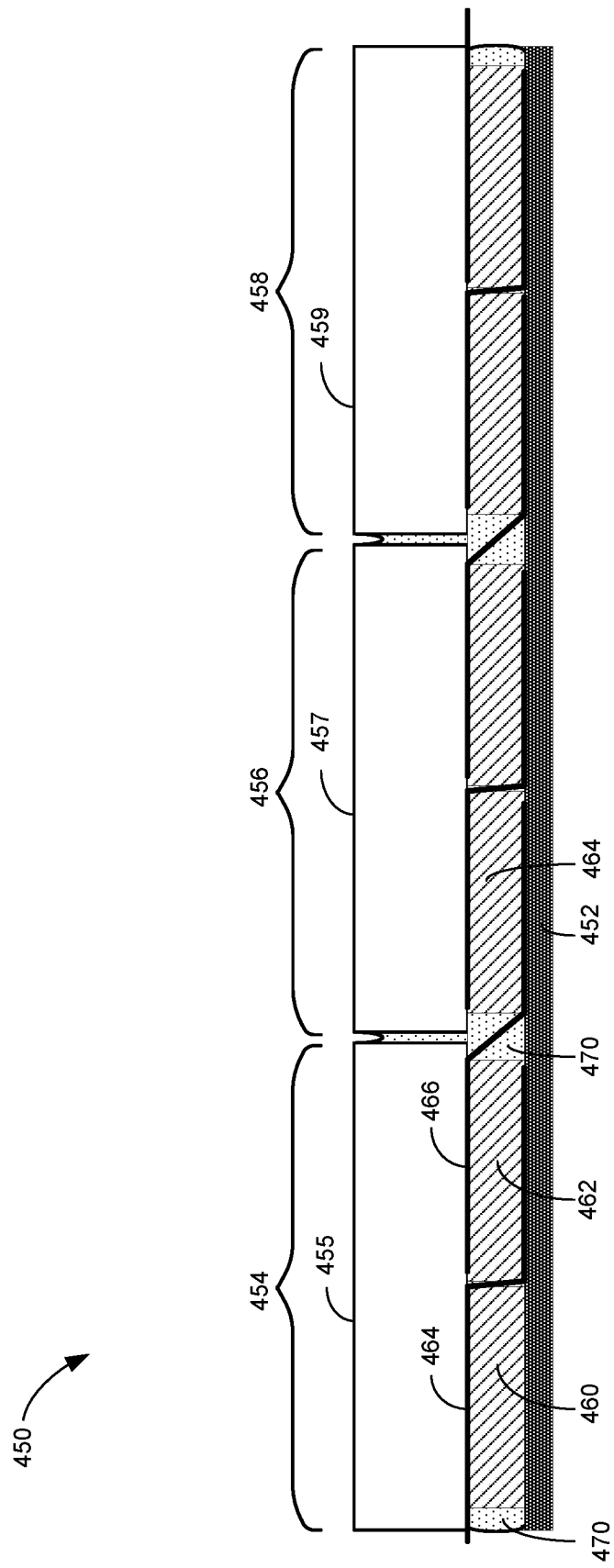
FIG. 4B illustrates a cross-section of an exemplary multi-tile module, according to one embodiment.

FIG. 4B illustrates a cross-section of an exemplary multi-tile module, according to one embodiment. In this example, multi-tile module 450 can include photovoltaic roof tiles 454, 456, and 458. These tiles can share common backsheet 452, and have three individual glass covers 455, 457, and 459, respectively. Each tile can encapsulate two solar cells. For example, tile 454 can include solar cells 460 and 462 encapsulated between backsheet 452 and glass cover 455. Tabbing strips can be used to provide electrical coupling within each tile and between adjacent tiles. For example, tabbing strip 464 can couple the front electrode of solar cell 460 to the back electrode of solar cell 462, creating a serial connection between these two cells. Similarly, tabbing strip 466 can couple the front electrode of cell 462 to the back electrode of cell 464, creating a serial connection between tile 454 and tile 456.

The gap between two adjacent PV tiles can be filled with encapsulant, protecting tabbing strips interconnecting the two adjacent tiles from the weather elements. For example, encapsulant 470 fills the gap between tiles 454 and 456, protecting tabbing strip 466 from weather elements. Furthermore, the three glass covers, backsheet 452, and the encapsulant together form a semi-rigid construction for multi-tile module 450. This semi-rigid construction can facilitate easier installation while providing a certain degree of flexibility among the tiles. In some embodiments, each PV roof tile can have its own front cover and back sheet, and adjacent PV roof tiles can be joined by a semi-rigid reinforcement spacer.

In addition to the examples shown in FIGS. 4A and 4B, a PV tile may include different forms of photovoltaic structures. For example, in order to reduce internal resistance, each square solar cell shown in FIG. 4A can be divided into multiple (e.g., three) smaller strips, each having edge busbars of different polarities on its two opposite edges. The edge busbars allow the strips to be cascaded one by one to form a serially connected string.

Figure 5A:
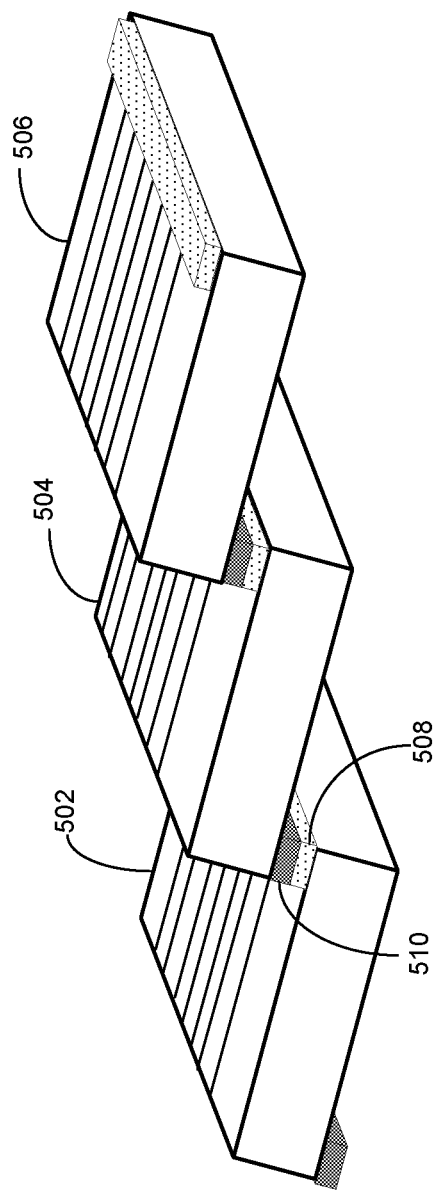
FIG. 5A illustrates a serial connection between three adjacent cascaded photovoltaic strips, according to one embodiment.

FIG. 5A illustrates a serial connection between three adjacent cascaded photovoltaic strips, according to one embodiment. In FIG. 5A, strips 502, 504, and 506 are stacked in such a way that strip 504 partially overlaps adjacent strip 506 to its right, and strip 502 to its left. The resulting string of strips forms a cascaded pattern similar to roof shingles. Strips 502 and 504 are electrically coupled in series via edge busbar 508 at the top surface of strip 502 and edge busbar 510 at the bottom surface of strip 504. Strips 502 and 504 can be arranged in such a way that bottom edge busbar 510 is above and in direct contact with top edge busbar 508. The coupling between strips 504 and 506 can be similar.

Figure 5B:
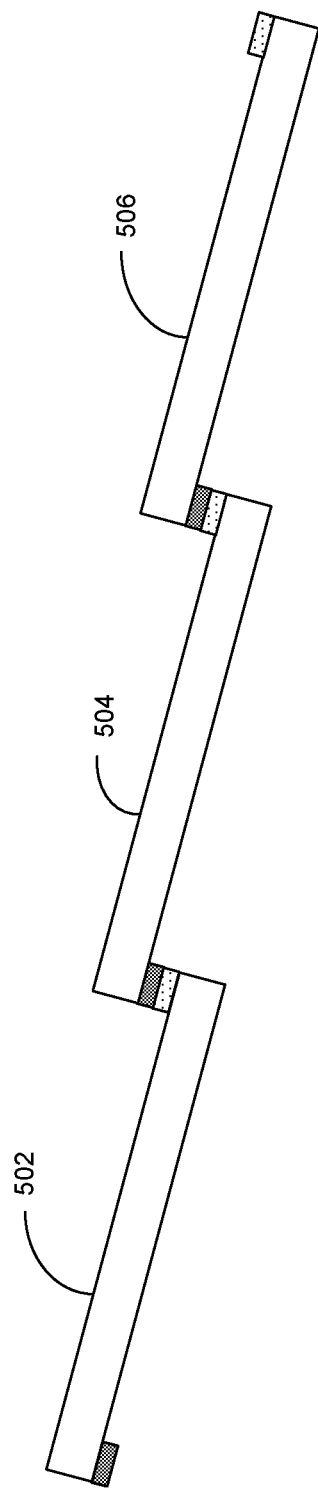
FIG. 5B illustrates the side view of the string of cascaded strips, according to one embodiment.

FIG. 5B illustrates the side view of the string of cascaded strips, according to one embodiment. In the example shown in FIGS. 5A and 5B, the strips can be segments of a six-inch square or pseudo-square solar cell, with each strip having a dimension of approximately two inches by six inches. To reduce shading, the overlapping between adjacent strips should be kept as small as possible. Therefore, in the example shown in FIGS. 5A and 5B, the single busbars (both at the top and the bottom surfaces) can be placed at or near the very edge of the strip. The same cascaded pattern can extend along multiple strips to form a serially connected string, and a number of strings can be coupled in series or parallel.

Figure 5C:
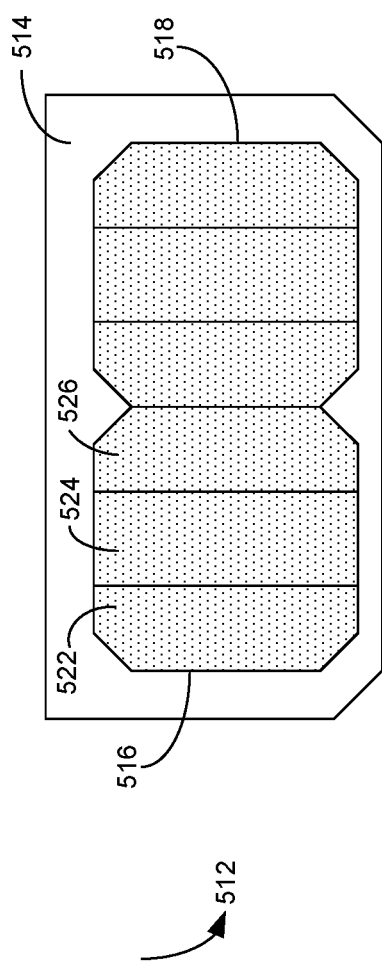
FIG. 5C illustrates an exemplary solar roof tile, according to one embodiment.

FIG. 5C illustrates an exemplary solar roof tile, according to one embodiment. A solar roof tile 512 includes top glass cover 514 and solar cells 516 and 518. The bottom cover (e.g., backsheet) of solar roof tile 512 is out of view in FIG. 5C. Solar cells 516 and 518 can be conventional square or pseudo-square solar cells, such as six-inch solar cells. In some embodiments, solar cells 516 and 518 can each be divided into three separate pieces of similar size. For example, solar cell 516 can include strips 522, 524, and 526. These strips can be arranged in such a way that adjacent strips are partially overlapped at the edges, similar to the ones shown in FIGS. 5A-5B. For simplicity of illustration, the electrode grids, including the finger lines and edge busbars, of the strips are not shown in FIG. 5C. In addition to the example shown in FIG. 5C, a solar roof tile can contain fewer or more cascaded strips, which can be of various shapes and size.

Figure 6:
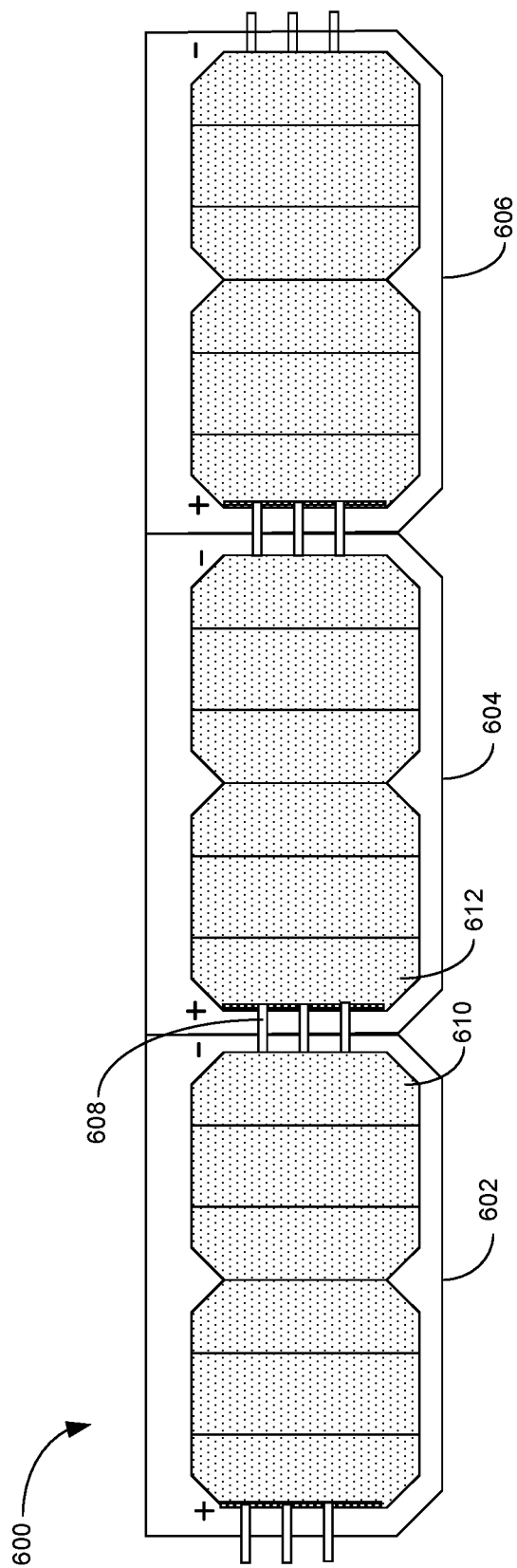
FIG. 6 shows the top view of an exemplary multi-tile module, according to one embodiment.

When multiple tiles are pre-assembled to form a multi-tile module, inter-tile electrical coupling needs to be established within the multi-tile module. One straightforward solution is to connect the tiles in series. FIG. 6 shows the top view of an exemplary multi-tile module, according to one embodiment. Multi-tile module 600 can include PV roof tiles 602, 604, and 606 arranged side by side. Each PV roof tile can include six cascaded strips encapsulated between the front and back covers. The cascaded strips within each PV roof tile form a serially connected string. Furthermore, metal tabs can be used to couple the strings enclosed in adjacent tiles in series by connecting the negative polarity of a string to the positive polarity of an adjacent string. For example, metal tab 608 can couple the edge busbar on the front side of strip 612 with the edge busbar on the back side of strip 610, creating a serial coupling between strips 610 and 612 and between the string within tile 602 and the string within tile 604. Although the example in FIG. 6 shows three metal tabs interconnecting the photovoltaic strips, other numbers of metal tabs can also be used. Furthermore, other coupling mechanisms, such as a single wide metallic tab overlapping the adjacent edge busbars of the adjacent tiles, can also be used to couple the tiles in series.

Note that the output voltage (e.g., the open-circuit voltage $V_{oc}$) of each smaller strip can still be the same as for the full-sized PV cell, but the current produced (e.g., the short-circuit current $I_{sc}$) and the resistance of each strip can be fractions of those of the full-sized cell. Dividing square cells into smaller strips and forming a cascaded string using those smaller strips generally can have the advantage of less power being lost to the series resistance, due to the reduced output current. However, coupling the multiple PV tiles, hence the multiple cascaded strings, in series may create a module with undesired output voltage and current. For robust design of a solar roof, one may wish each individual module to provide output voltage and current at a predetermined reasonable range. Too high an output voltage or too low an output current can make interconnecting these multi-tile modules difficult. Assuming the open-circuit voltage ($V_{oc}$) and short-circuit current ($I_{sc}$) for a conventional 6-inch square cell are $V_{oc\_cell}$ and $I_{sc\_cell}$, respectively, the $V_{oc}$ and $I_{sc}$ for multi-tile module 600 shown in FIG. 6 can be roughly $18 \times V_{oc\_cell}$ and $I_{sc\_cell}/3$. This can result in the output voltage of the multi-tile module being too high (e.g., approximately $17 \times V_{oc\_cell}$) and the output current of the multi-tile module being too low (e.g., approximately $I_{sc\_cell}/3$) for any practical usage.

Figure 7A:
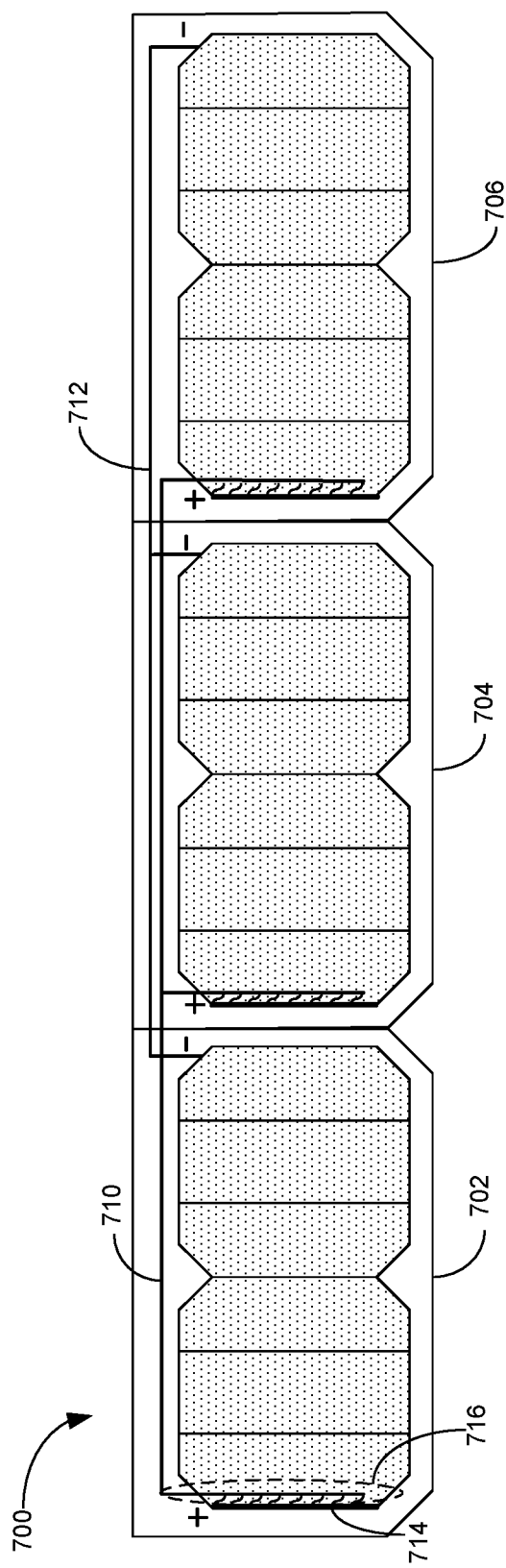
FIG. 7A shows the inter-tile coupling within an exemplary solar roof tile module, according to one embodiment.

To enable robust solar roof design, in some embodiments, the PV tiles within each individual multi-tile module can be coupled to each other in parallel. FIG. 7A shows the inter-tile coupling within an exemplary solar roof tile module, according to one embodiment. Solar module 700 can include solar roof tiles 702, 704, and 706 arranged side by side. Solar roof tiles 702, 704, and 706 can be similar to solar roof tile 512 shown in FIG. 5C. Each solar roof tile can include six cascaded strips encapsulated between the front and back covers, meaning that busbars located at opposite edges of the cascaded string of strips have opposite polarities. For example, if the leftmost edge busbar of the strips in solar roof tile 702 has a positive polarity, then the rightmost edge busbar of the strips will have a negative polarity. Parallel connections can be established among the tiles by electrically coupling busbars having the same polarity.

In the example shown in FIG. 7A, the solar roof tiles are arranged in such a way that their sun-facing sides have the same electrical polarity. As a result, the edge busbars of the same polarity will be on the same left or right edge. For example, the leftmost edge busbar of all solar roof tiles can have a positive polarity and the rightmost edge busbar of all solar roof tiles can have a negative polarity, or vice versa. In FIG. 7A, the left edge busbars of all strips have a positive polarity (indicated by the "+" signs) and are located on the sun-facing (or front) surface of the strips, whereas the right edge busbars of all strips have a negative polarity (indicated by the "−" signs) and are located on the back surface. Depending on the design of the layer structure of the solar cell, the polarity and location of the edge busbars can be different from those shown in FIG. 7A.

A parallel connection among the tiles can be formed by electrically coupling all leftmost busbars together via metal tab 710 and all rightmost busbars together via metal tab 712. As a result, the $V_{oc}$ of multi-tile module 700 can be 6× $V_{oc\_cell}$ and the $I_{sc}$ of multi-tile module 700 can be $I_{sc\_cell}$, both being within a reasonable range to allow for robust solar roof design using the multi-tile modules.

Metal tabs 710 and 712 are also known as connection buses and typically can be used for interconnecting individual solar cells or strings. A metal tab can be stamped, cut, or otherwise formed from conductive material, such as copper. Copper is a highly conductive and relatively low-cost connector material. However, other conductive materials such as silver, gold, or aluminum can be used. In particular, silver or gold can be used as a coating material to prevent oxidation of copper or aluminum. In some embodiments, alloys that have been heat-treated to have super-elastic properties can be used for all or part of the metal tab. Suitable alloys may include, for example, copper-zinc-aluminum (CuZnAl), copper-aluminum-nickel (CuAlNi), or copper-aluminum-beryllium (CuAlBe). In addition, the material of the metal tabs disclosed herein can be manipulated in whole or in part to alter mechanical properties. For example, all or part of metal tabs 710 and 712 can be forged (e.g., to increase strength), annealed (e.g., to increase ductility), and/or tempered (e.g., to increase surface hardness).

The coupling between a metal tab and a busbar can be facilitated by a specially designed strain-relief connector. In FIG. 7A, strain-relief connector 716 can be used to couple busbar 714 and metal tab 710. Such strain-relief connectors are needed due to the mismatch of the thermal expansion coefficients between metal (e.g., Cu) and silicon. More particularly, metal tends to expand or contract more than Si-based photovoltaic strips when the solar roof tile is heated or cooled, thus initiating shear forces at bonded joints between the metal tabs and the photovoltaic strips. Specially designed strain-relief connectors can help alleviate destructive thermal expansion and contraction effects in the solar roof tiles.

As shown in FIG. 7A, the metal tabs (e.g., tabs 710 and 712) may cross paths with strain-relief connectors of opposite polarities. To prevent an electrical short of the photovoltaic strips, portions of the metal tabs and/or strain-relief connectors can be coated with an insulation film or wrapped with a sheet of insulation material.

Figure 7B:
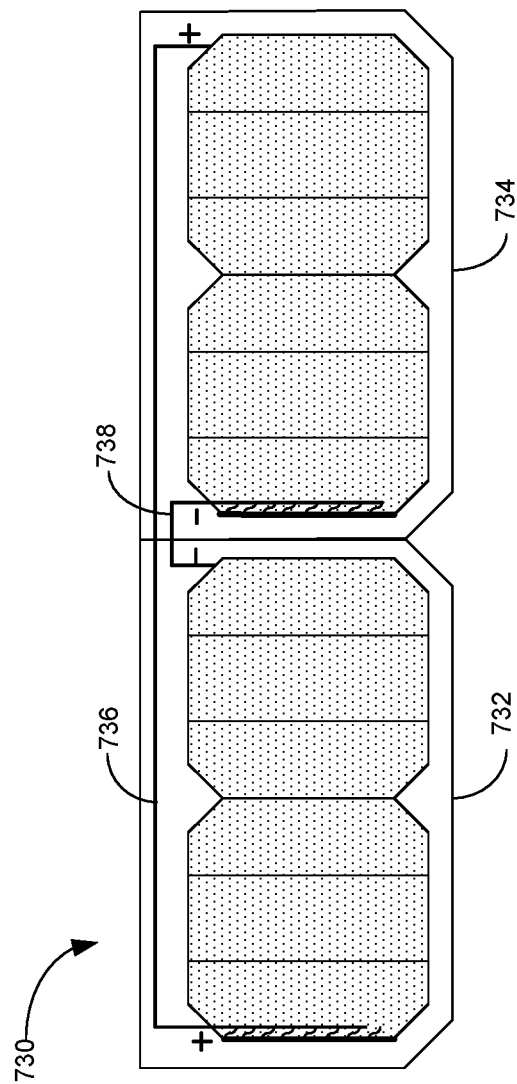
FIG. 7B shows the inter-tile coupling within an exemplary solar roof tile module, according to one embodiment.

Other tile configurations can also be possible. For example, the solar roof tiles can be arranged such that the sun-facing sides of the different tiles may have different electrical polarities. FIG. 7B shows the inter-tile coupling within an exemplary solar roof tile module, according to one embodiment. Multi-tile module 730 can include solar roof tiles 732 and 734 arranged side by side. Solar roof tiles 732 and 734 can have an opposite polarity arrangement. More specifically, the leftmost edge busbar of solar roof tile 734 can have a negative polarity and the rightmost edge busbar of solar roof tile 734 can have a positive polarity, contrary to those of solar roof tile 732. Accordingly, a parallel connection can be achieved by coupling the leftmost edge busbars of solar roof tiles 732 with the rightmost edge busbar of solar roof tile 734 via metal tab 736 and by coupling the rightmost edge busbars of solar roof tiles 732 with the leftmost edge busbar of solar roof tile 734 via metal tab 738. As one can see in FIG. 7B, the closeness between the edge busbars having negative polarity can make it possible to use other forms of coupling mechanisms (e.g., a single tab overlapping both edge busbars). Alternatively, the roof tiles in FIG. 7B can be designed such that their adjacent edge busbars may overlap to facilitate the parallel coupling. In the example shown in FIG. 7B, multi-tile module 730 includes two PV roof tiles coupled to each other in parallel; the $V_{oc}$ and $I_{sc}$ of multi-tile module 730 can be $6 \times V_{oc\_cell}$ and $\frac{2}{3} \times I_{sc\_cell}$, respectively. Such $V_{oc}$ and $I_{sc}$ are both within the desired range.

Figure 8C:
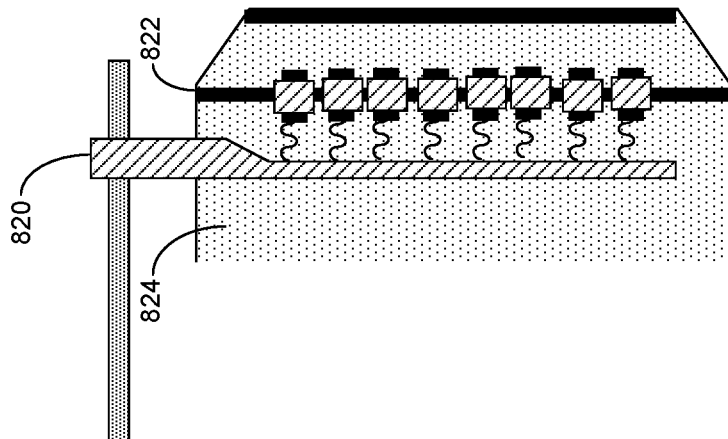
FIG. 8C illustrates the coupling between a strain-relief connector and the back side of a photovoltaic structure, according to one embodiment.
Figure 8B:
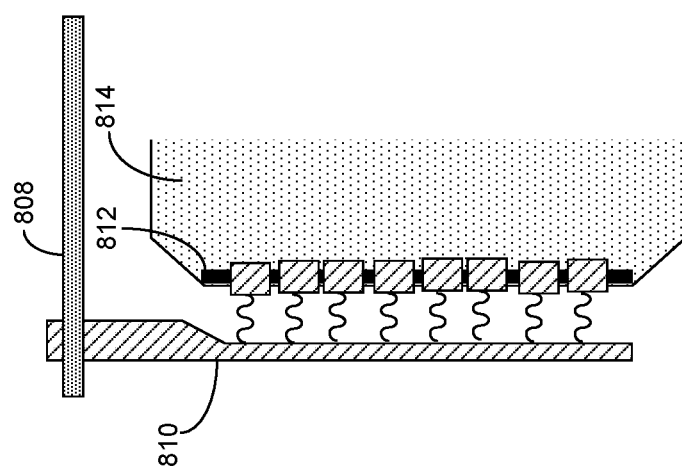
FIG. 8B illustrates the coupling between a strain-relief connector and the front side of a photovoltaic structure, according to one embodiment.
Figure 8A:
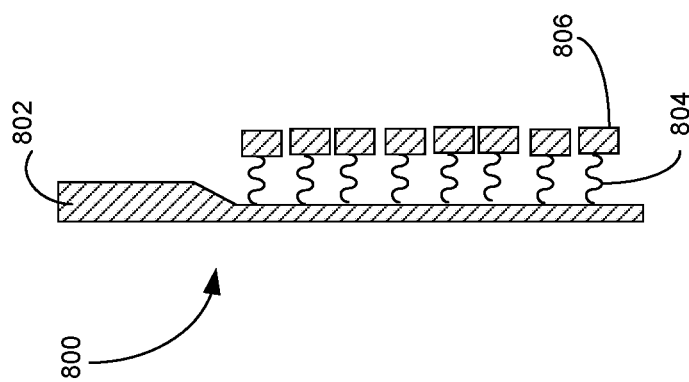
FIG. 8A shows a detailed view of an exemplary strain-relief connector, according to one embodiment.

FIG. 8A shows a detailed view of an exemplary strain-relief connector, according to one embodiment. In FIG. 8A, strain-relief connector 800 can include elongated connection member 802, a number of curved metal wires (e.g., curved metal wire 804), and a number of connection pads (e.g., connection pad 806). Elongated connection member 802 can extend along a direction substantially parallel to the to-be-coupled busbar of a photovoltaic structure. The curved metal wires can extend laterally from elongated connection member 802 in a non-linear manner (i.e., having non-linear geometry). Non-linear geometry can include paths that centrally follow a curved wire (e.g., a path that extends along a series of centermost points located between outermost edges) or along any face or edge of the wire. A curved wire having non-linear geometry can have, but does not require, symmetry along the path of elongation. For example, one edge, or portion of an edge, of a curved wire can be straight and an opposite edge can include one or more curves, cuts, or extensions. Curved wires having non-linear geometry can include straight portions before, after, and/or between non-linear portions. Non-linear geometry can include propagating paths that extend laterally along a first axis (e.g., X axis) while alternating direction in negative and positive directions of one or more other axes (e.g., Y axis and/or Z axis) that are perpendicular to the first axis, in a repetitive manner, such as a sine wave or helix. While the curved wires disclosed herein use curved profiles, non-linear geometry can be constructed from a series of straight lines; for example, propagating shapes, such as square or sawtooth waves, can form non-linear geometry. These curved wires can relieve the strain generated due to the mismatch of thermal expansion coefficients between the metal connector and the Si-based photovoltaic structure.

In some embodiments, each curved metal wire can be attached to a connection pad. For example, curved metal wire 804 can be attached to connection pad 806. In alternative embodiments, more than one (e.g., two or three) curved wire can be attached to a connection pad. The elongated connection member 802, the curved wires, and the connection pads can be formed (e.g., stamped or cut) from a single piece of material, or they can be attached to each other by any suitable electrical connection, such as by soldering, welding, or bonding.

FIG. 8B illustrates the coupling between a strain-relief connector and the front side of a photovoltaic structure, according to one embodiment. More specifically, strain-relief connector 810 is coupled to edge busbar 812 of photovoltaic structure 814 by overlapping its connection pads with the front side of edge busbar 812. FIG. 8B also shows the coupling between strain-relief connector 810 and metal tab 808. More specifically, strain-relief connection 810 can be in direct contact with metal tab 808, and the metal-to-metal contact can create an electrical coupling. In some embodiments, electrically conductive adhesive (ECA) can be applied to electrically and mechanically couple strain-relief connector 810 and metal tab 808. Metal tab 808 can be similar to metal tab 710 or 712 shown in FIG. 7A and can be used to couple one PV tile to an adjacent PV tile.

FIG. 8C illustrates the coupling between a strain-relief connector and the back side of a photovoltaic structure, according to one embodiment. More specifically, strain-relief connector 820 can be coupled to busbar 822 of photovoltaic structure 824 by overlapping its connection pads with contact pads belonging to busbar 822. ECA can also be applied to create an electrical and mechanical bond. Note that, unlike the front side, the back side of a photovoltaic structure can include additional busbars because there is no need to worry about shading on the back side. To facilitate better adhesion and electrical access, the additional busbars on the back side of the PV structure can also include widened regions, known as contact pads. Detailed descriptions of such contact pads can be found in U.S. patent application Ser. No. 14/831,767, filed Aug. 20, 2015, and entitled "PHOTOVOLTAIC ELECTRODE DESIGN WITH CONTACT PADS FOR CASCADED APPLICATION," the disclosure of which is incorporated herein by reference in its entirety.

Inter-Module Connections

Installation of a solar roof can involve laying (preferably in a certain overlapping way to prevent water leakage) the prefabricated multi-tile modules on the rooftop and electrically interconnecting the multi-tile modules so that they can collectively generate a power output.

Figure 9:
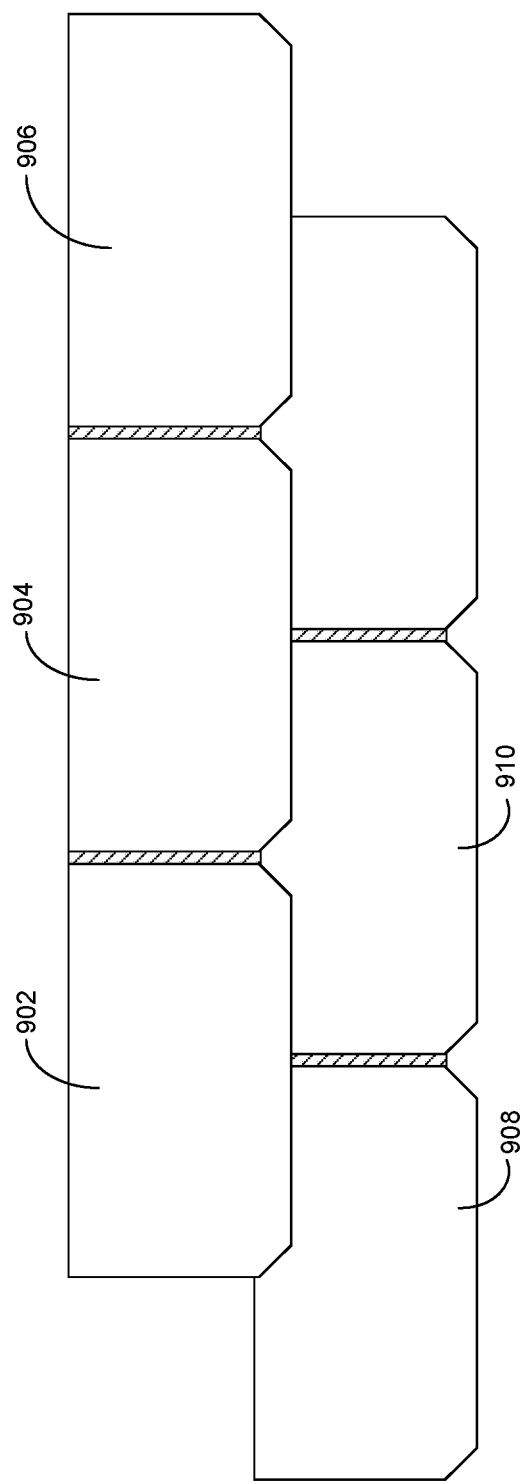
FIG. 9 illustrates multiple photovoltaic roof tiles installed in an overlapping configuration, according to an embodiment.

FIG. 9 illustrates multiple photovoltaic roof tiles installed in an overlapping configuration, according to an embodiment. In FIG. 9, a multi-tile module containing PV roof tiles 902, 904, and 906 can overlap with a multi-tile module positioned on a different row of the roof. The multi-tile modules are arranged in such a way that PV tiles (e.g., PV tiles 902 and 904) can overlap, at their lower edges, PV roof tiles (e.g., PV tiles 908 and 910) positioned on a different row in an offset manner such that the gap between adjacent tiles in one row somewhat align with the center of a PV roof tile located at another row. This arrangement can prevent possible water leakage through the gaps between adjacent PV tiles. Note that, in practice, the gaps can be filled by encapsulant or semi-rigid spacers used to couple adjacent PV tiles within the same multi-tile module. Detailed descriptions regarding the spacer can be found in U.S. patent application Ser. No. 15/900,636, filed Feb. 20, 2018 and entitled "INTER-TILE SUPPORT FOR SOLAR ROOF TILES," the disclosure of which is incorporated herein by reference in its entirety Because the photovoltaic structures and the inner- and inter-tile electrical interconnects are encapsulated between the front and back covers of the PV tiles, external lead wires are needed to facilitate inter-module electrical interconnection. In some embodiments, an external lead wire of a solar module can be achieved by creating through holes at appropriate positions on the back cover of the tiles and by creating electrical contacts to the metal tabs that are encapsulated inside the tiles.

Figure 10A:
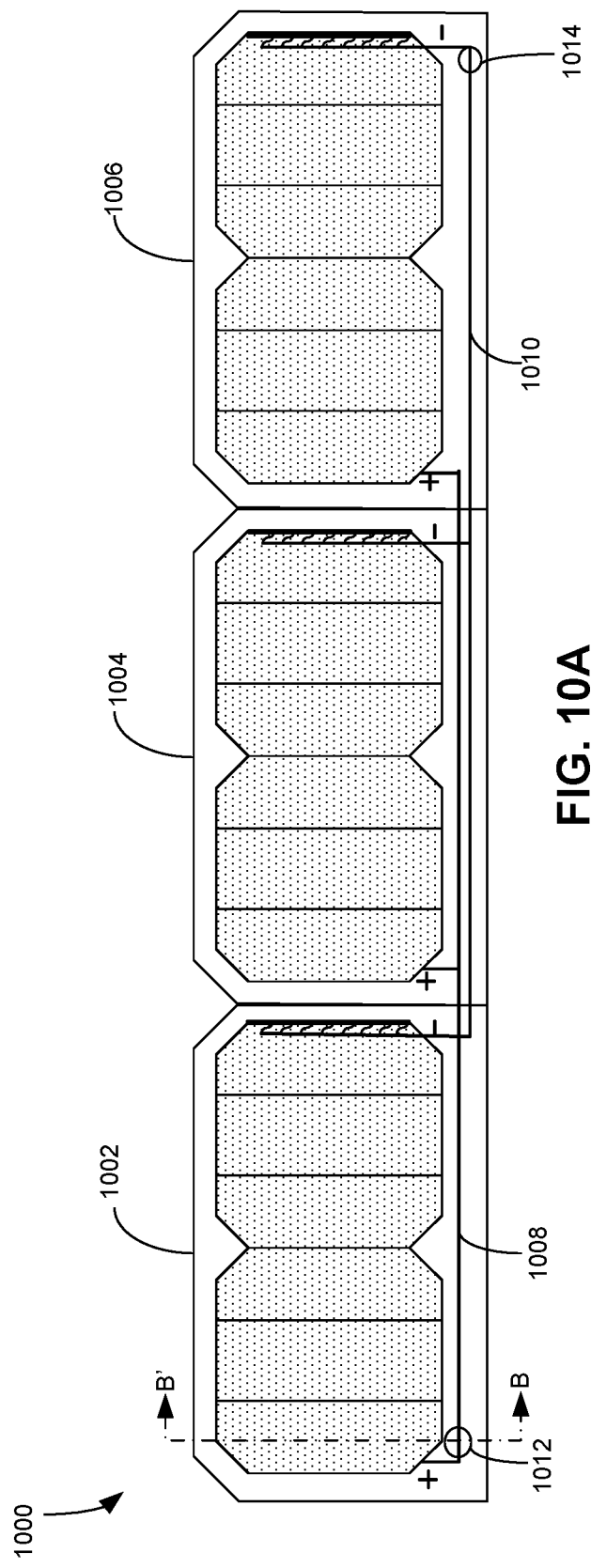
FIG. 10A shows the bottom view of an exemplary tile module, according to one embodiment of the present invention.

FIG. 10A shows the bottom view of an exemplary tile module, according to one embodiment of the present invention. For illustration purposes, the bottom covers of the solar roof tiles are shown as transparent. In practice, the bottom covers typically are non-transparent, such as back sheets or glasses with dark colored coatings. Multi-tile module 1000 includes PV tiles 1002, 1004, and 1006, and each tile can include a number (e.g., six) of cascaded photovoltaic strips. Metal tabs 1008 and 1010 couple the PV tiles in parallel, such that edge busbars of positive polarity are coupled to metal tab 1008 and edge busbars of negative polarity are coupled to metal tab 1010. If one views multi-tile module 1000 as a battery, metal tabs 1008 and 1010 can provide the positive and negative outputs, respectively, of the battery. Hence, by allowing contacts between external lead wires and metal tabs 1008 and 1010, one can output power from multi-tile module 1000 via the external wires. In some embodiments, through holes can be created on the back cover of multi-tile module 1000 to enable electrical contacts between a pair of external lead wires and metal tabs 1008 and 1010.

In FIG. 10A, through holes 1012 and 1014 are created on the back cover of tiles 1002 and 1006, respectively. More specifically, through hole 1012 can be positioned above a portion of metal tab 1008, and through hole 1014 can be created beneath a portion of metal tab 1010. To prevent encapsulant from filling the through holes during lamination, in some embodiments, a gasket (e.g., a rubber or PTFE O-ring) can be inserted into each through hole prior to the lamination process.

Figure 10B:
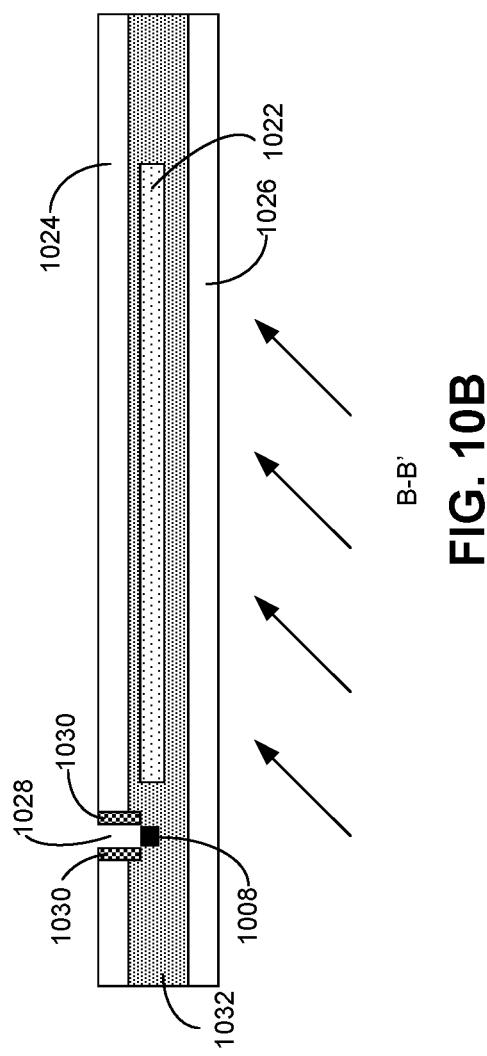
FIG. 10B shows the cross-sectional view along cut plane B-B', according to one embodiment.

FIG. 10B shows the cross-sectional view along cut plane B-B', according to one embodiment. The arrows show the direction of the sunlight. In FIG. 10B, photovoltaic strip 1022 is positioned between back cover 1024 and front cover 1026, and metal tab 1008 is positioned adjacent to the front surface of photovoltaic strip 1022. Metal tab 1008 is coupled to a busbar located on the front surface of photovoltaic strip 1022. Through hole 1028 is created on back cover 1024, directly above a portion of metal tab 1008. Gasket 1030 is inserted inside through hole 1028 to create a passage to metal tab 1008. Encapsulant 1032 can fill the remaining void between front cover 1026 and back cover 1024. As one can see from FIG. 10B, a passage to metal tab 1008 can be formed by through hole 1028 and gasket 1030. By carefully designing the size and shape of gasket 1030 to match those of through hole 1028, one can prevent contamination of metal tab 1008 by encapsulant 1032 during lamination.

Figure 10C:
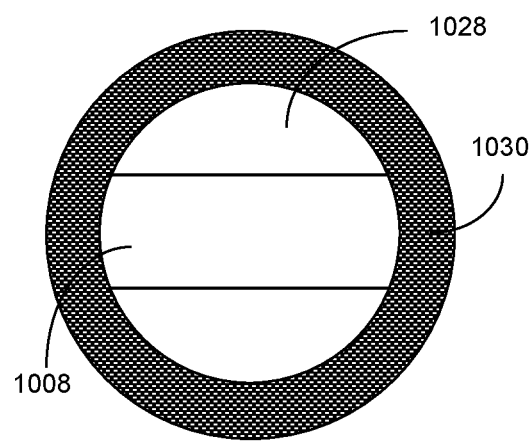
FIG. 10C shows the top view of the through hole, according to one embodiment.
Figure 10D:
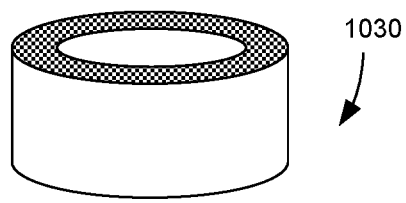
FIG. 10D shows an exemplary gasket, according to one embodiment.

FIG. 10C shows the top view of the through hole, according to one embodiment. In FIG. 10C, a portion of metal tab 1008 is exposed via through hole 1028. FIG. 10D shows an exemplary gasket, according to one embodiment. In some embodiments, gasket 1030 can be similar to an O-ring.

In some embodiments, a specially designed attachment pad (typically made of metal) can be inserted into the gasket. The attachment pad can include a flat (sometimes round) piece for making contact with the exposed portion of the metal tab and an extension post extending beyond the surface of the gasket and the back cover. The busbar of the photovoltaic strip, the metal tab, and the attachment pad together can create a conductive path from one side of the photovoltaic strip to the exterior of the tile. In some embodiments, the extension post of the attachment pad can be enclosed inside a junction box, which can provide electrical insulation and weather protection for the attachment pad.

Figure 11A:
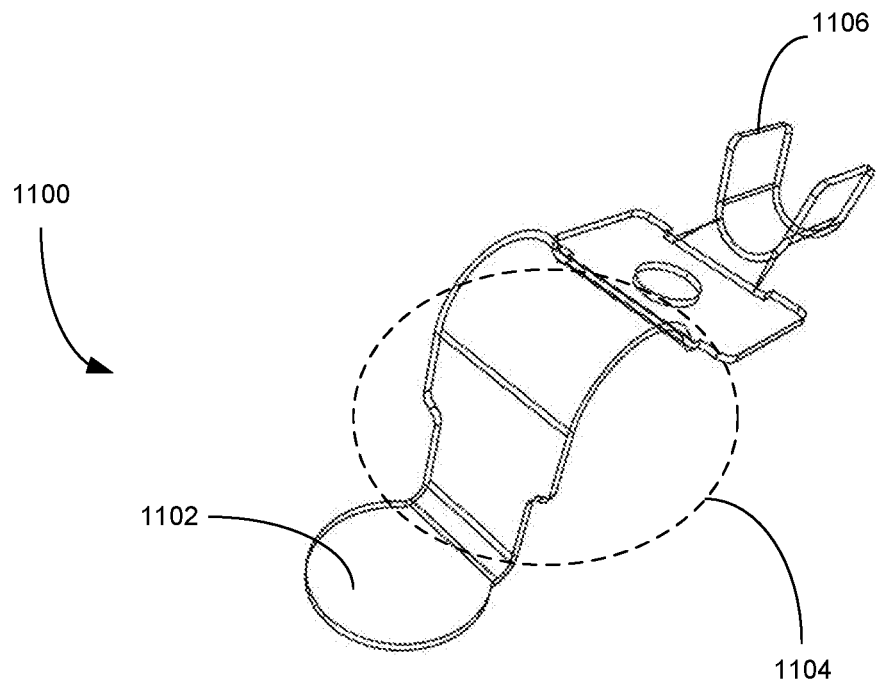
FIG. 11A shows an exemplary attachment pad, according to one embodiment.

FIG. 11A shows an exemplary attachment pad, according to one embodiment. Attachment pad 1100 can include contact pad 1102, extension post 1104, and wire coupler 1106. When inserted into the gasket, contact pad 1102 can be directly in contact with the exposed portion of a metal tab that is electrically coupled to the busbar of the photovoltaic strips. Extension post 1104 can be designed in such a way that its length is greater than the thickness of the back cover. Wire coupler 1106 is positioned on the end of extension post 1104 and can be configured to couple to a lead wire. Attachment pad 1100 can be made of low-resistant metallic materials, such as Cu. In some embodiments, a junction box can be used to protect the attachment pad, more particularly the coupling between wire coupler 1106 and the lead wire, from the weather. In addition, the junction box can insulate the attachment pad from other parts of the module, thus preventing leakage or shorting.

Figure 11B:
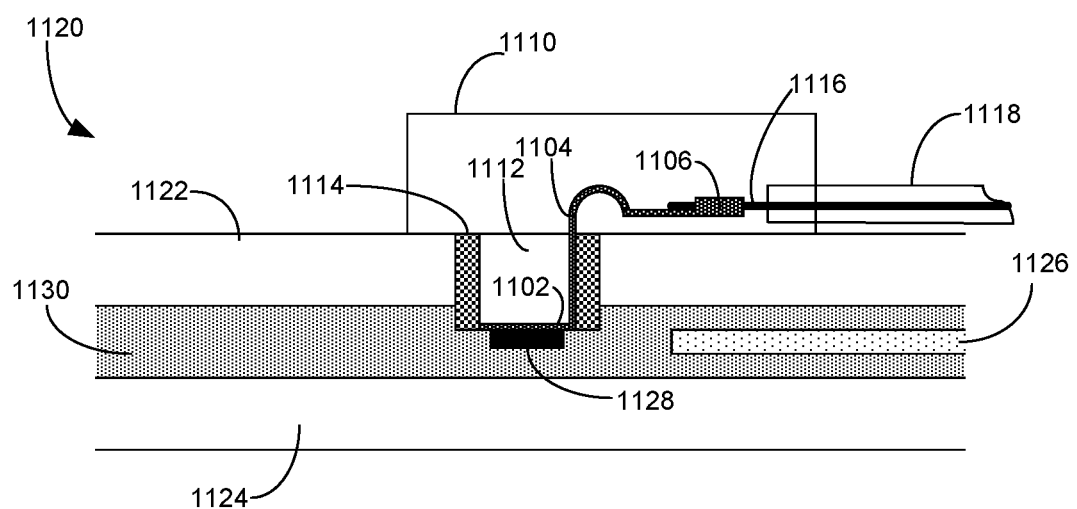
FIG. 11B shows the attachment pad placed inside the junction box, according to one embodiment.

FIG. 11B shows the attachment pad placed inside the junction box, according to one embodiment. More specifically, FIG. 11B shows the amplified view of a PV tile at a location near the junction box. PV tile 1120 can include back cover 1122, front cover 1124, and photovoltaic strip 1126 encapsulated between back cover 1122 and front cover 1124. Metal tab 1128 is in contact with a busbar (e.g., an edge busbar) on photovoltaic strip 1126 and can be used to electrically couple photovoltaic strip 1126 with photovoltaic strips encapsulated in adjacent solar roof tiles. Through hole 1112 can be formed within back cover 1122 at a location directly above a portion of metal tab 1128. The location of through hole 1112 can be determined based on locations and/or sizes of other components of the solar roof tile module, such as the junction box, the inter-module spacer, etc. Gasket 1114 can be inserted into through hole 1112, preventing encapsulant 1130 from filling through hole 1112 during lamination. Encapsulant 1130 then fills the remaining empty space between back cover 1122 and front cover 1124.

Junction box 1110 can be placed on back cover 1122, directly above through hole 1112. An attachment pad can be inserted through gasket 1114, resulting in contact pad 1102 being in direct physical contact with metal tab 1128. In some embodiments, to ensure low-resistance contact, metal tab 1128 can include a widened section that is in contact with contact pad 1102. Extension post 1104 of the attachment pad extends out of through hole 1112 into junction box 1110. Inside junction box 1110, lead wire 1116 can be coupled to wire coupler 1106 of the attachment pad. In some embodiments, lead wire 1116 can include bare copper wire. The coupling can include a metal-to-metal contact. Before exiting junction box 1110, lead wire 1116 can be inserted into weatherproof jacket 1118. Junction box 1110 can also be weatherproof. This way, electrical coupling to the photovoltaic strips from the exterior of the solar roof tile module can be provided in a weatherproof manner, thus enabling inter-module coupling.

Figure 12:
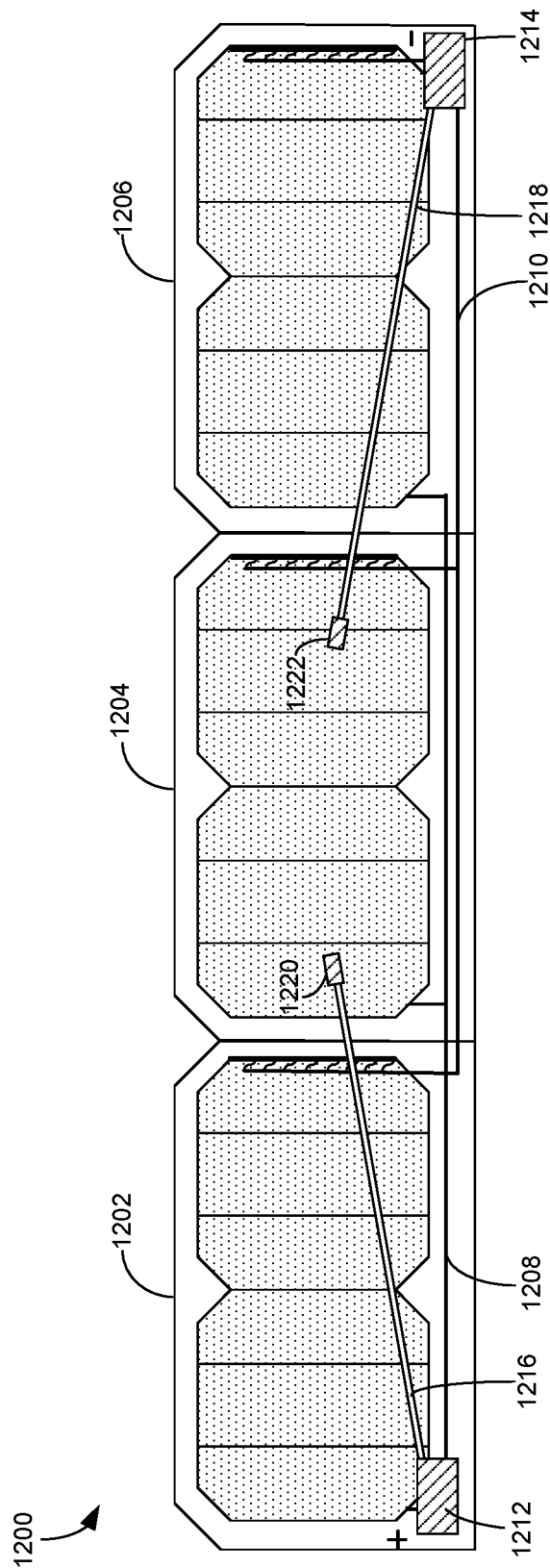
FIG. 12 shows the bottom view of an exemplary tile module with the inter-module coupling cables, according to one embodiment of the present invention.

FIG. 12 shows the bottom view of an exemplary tile module with the inter-module coupling cables, according to one embodiment of the present invention. Multi-tile module 1200 can include three PV tiles 1202, 1204, and 1206. In some embodiments, PV tiles 1202, 1204, and 1206 can be coupled in parallel via metal tabs 1208 and 1210. For example, metal tab 1208 can be coupled to positive-polarity busbars of all PV tiles within the module, whereas metal tab 1210 can be coupled to negative-polarity busbars of all PV tiles. Multi-tile module 1200 can also include junction boxes 1212 and 1214, both positioned on the back side of multi-tile module 1200. Similar to junction box 1110 shown in FIG. 11B, junction boxes 1212 and 1214 facilitate electrical coupling between weatherproof lead wires and metal tabs that couple the solar roof tiles. For example, junction box 1212 facilitates electrical coupling between weatherproof lead wire 1216 and metal tab 1208. Similarly, junction box 1214 facilitates electrical coupling between weatherproof lead wire 1218 and metal tab 1210. Therefore, weatherproof lead wires 1216 and 1218 are electrically coupled to the positive and negative polarities, respectively, of all PV tiles. Each weatherproof lead wire can also include a cable coupler, also weatherproof, for coupling to a lead wire of another tile module. Lead wire 1216 includes a cable coupler 1220, and lead wire 1218 includes a cable coupler 1222. During roof installation, depending on the layout and electrical design of the roof, an installer can interconnect individual multi-tile modules using the weatherproof lead wires. Additional bussing cables may also be used to facilitate inter-module electrical couplings.

This modular approach also facilitates electrical coupling during installation on a roof. A roof installer can easily connect multiple multi-tile modules in parallel or series, by fitting together the multiple multi-tile modules arranged either horizontally or vertically along the roof surface. In one embodiment, each multi-tile module can be contained within a harness or "black box" with a predetermined output voltage and current. An installer can efficiently electrically connect these "black boxes" according to a pre-authorized building plan. The electrical interconnects can be achieved while the multi-tile modules are laid on the rooftop.

In an embodiment, all PV modules on a roof may be interconnected either in parallel or series. Alternatively, it is also possible to combine parallel and serial connections. For example, a group of multi-tile modules can be coupled in series, and then the entire group can couple to a different group in parallel. In an embodiment, the multi-tile modules can be attached to a roof batten, which can be configured to facilitate parallel and/or serial electrical connections among the multi-tile modules.

In the examples shown in FIGS. 7A and 7B, the multiple PV roof tiles within a multi-tile module are arranged horizontally. In practice, it is also possible to arrange the multiple PV tiles within a multi-tile module vertically. In such a scenario, the design of the electrical interconnections needs to change accordingly. In addition, the number of PV tiles within each module is not limited by the example shown in FIGS. 7A and 7B. More specifically, a module having a similar construction (e.g., as shown in FIGS. 10A-12) but containing only a single PV roof tile may be of a particular interest, because it can provide additional layout flexibility. In particular, the external lead wires allow all connections among PV roof tiles to be made at the time of installation. Therefore, these single-tile modules can provide the installer with additional freedom to interconnect all the PV roof tiles in parallel or series, or a mixture of both. For example, the installer may connect a number of single-tile modules in series to form a group, and then connect multiple groups of serially connected modules in parallel.

Module Fabrication

Figure 13:
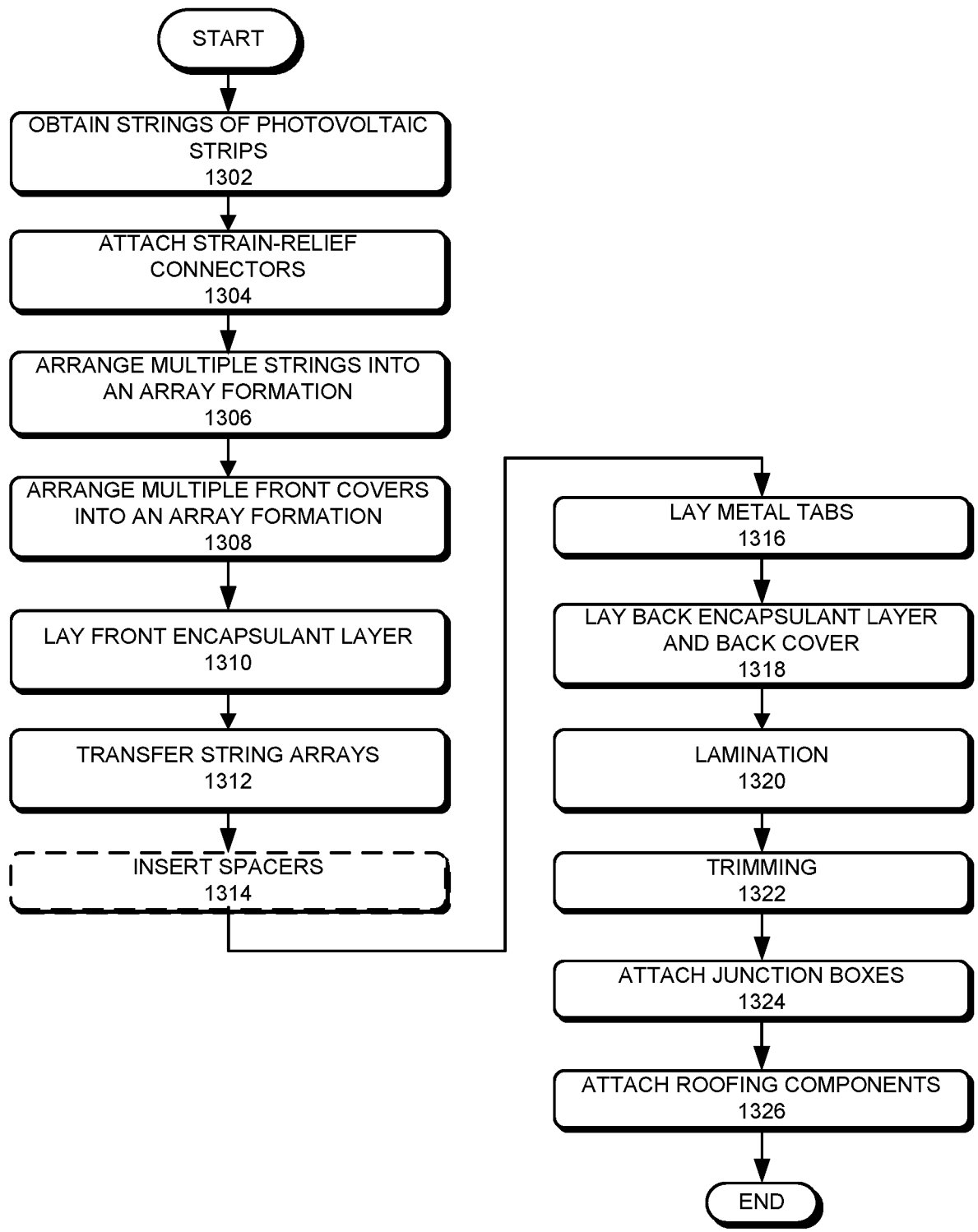
FIG. 13 shows an exemplary fabrication process of a multi-tile roof module, according to an embodiment of the invention In the figures, like reference numerals refer to the same figure elements.

FIG. 13 shows an exemplary fabrication process of a multi-tile roof module, according to an embodiment of the invention. During fabrication, multiple strings of photovoltaic strips can be obtained (operation 1302). More specifically, photovoltaic strips can be obtained by dividing a standard square or pseudo-square solar cell into multiple pieces, and a string of strips can be formed by cascading multiple strips at the edges. The cascading forms a serial connection among the strips. Detailed descriptions about the formation of a cascaded string of photovoltaic strips can be found in U.S. patent application Ser. No. 14/826,129, entitled "PHOTOVOLTAIC STRUCTURE CLEAVING SYSTEM," filed Aug. 13, 2015; U.S. patent application Ser. No. 14/866,776, entitled "SYSTEMS AND METHODS FOR CASCADING PHOTOVOLTAIC STRUCTURES," filed Sep. 25, 2015; U.S. patent application Ser. No. 14/804,306, entitled "SYSTEMS AND METHODS FOR SCRIBING PHOTOVOLTAIC STRUCTURES," filed Jul. 20, 2015; U.S. patent application Ser. No. 14/866,806, entitled "METHODS AND SYSTEMS FOR PRECISION APPLICATION OF CONDUCTIVE ADHESIVE PASTE ON PHOTOVOLTAIC STRUCTURES," filed Sep. 25, 2015; and U.S. patent application Ser. No. 14/866,817, entitled "SYSTEMS AND METHODS FOR TARGETED ANNEALING OF PHOTOVOLTAIC STRUCTURES," filed Sep. 25, 2015; the disclosures of which are incorporated herein by reference in their entirety.

In some embodiments, each individual solar roof tile may include one string, and each string can include six cascaded strips. The outputs of a string are busbars located at opposite sides and edges of the string. Additional busbars may also be added to the string to satisfy the spatial constraints imposed onto the junction boxes. An additional busbar can run alongside an edge busbar but is away from the edge. Subsequent to the formation of a string, strain-relief connectors can be attached to appropriate busbars (e.g., an edge busbar or an additional busbar away from the edge) (operation 1304). Various electrical coupling methods can be used to attach the strain-relief connectors to the busbars, including but not limited to: soldering, welding, or bonding with electrically conductive adhesive (ECA). In some embodiments, the strain-relief connectors may be coated with a masking layer (e.g., a layer of acrylic paint), and to protect the integrity of the masking layer, ECA is used to bond the strain-relief connectors to the busbars. Because the busbars can reside on opposite sides of the photovoltaic string, attaching the strain-relief connectors to the busbars may require flipping over the string.

Multiple strings along with their strain-relief connectors can then be arranged into a matrix or array formation that corresponds to the formation of a multi-tile module (operation 1306). For example, to obtain a multi-tile module having three side-by-side tiles (e.g., as shown in FIG. 7A), three strings can be arranged along a straight line, and the distance between adjacent strings can be determined based on the size of the tiles and the gap between the tiles. Similarly, front covers of multiple solar roof tiles can be arranged into a formation that corresponds to the formation of the tile module (operation 1308), and front encapsulant layer can be laid on the covers (operation 1310).

In some embodiments, three separate covers, each corresponding to a respective tile, can be used for the tile module. Alternatively, a single piece of glass cover can be used for all three tiles, and grooves can be etched on the single glass cover to create the appearance of three individual roof tiles. In a further embodiment, the front cover of the tile module may include three separate pieces of glass, whereas the back cover of the tile module may include a single continuous backsheet. Similarly, the encapsulant layer can be three separate pieces or a continuous piece of material.

The array of strings can then be transferred and placed on top of the front encapsulation layer and covers (operation 1312), and, optionally, spacers can be inserted between adjacent tiles (operation 1314). Note that the spacer may not be used if both the front and back covers are made of a single piece of glass.

Metal tabs (e.g., metal tabs 710 and 712 shown in FIG. 7A) can then be laid out, directly contacting the strain-relief connectors (operation 1316). In some embodiments, metal tabs can be laid out in such a way that the multiple strings can be coupled to each other in parallel. ECA can also be used to electrically and mechanically couple the metal tabs and strain-relief connectors. Subsequently, a back encapsulant layer and a back cover (or multiple back covers) are laid on top of the array of strings (operation 1318). In some embodiments, the back encapsulant layer and the back cover of the tile module can include through holes, and gaskets can be inserted inside the through holes. The locations of these through holes correspond to the locations of subsequently attached junction boxes. A lamination process can then be performed to encapsulate the strings, the strain-relief connectors, and the metal tabs between the front and back covers (operation 1320). The gaskets inserted into the through holes create a clear path to an exposed portion of the metal tabs.

Subsequent to the lamination, the edges of the multi-tile module can be trimmed to eliminate excessive encapsulant (operation 1322) and the junction boxes are attached (operation 1324). Attaching a junction box can include inserting an attachment pad within the junction box into the center of the gasket. Other roofing components (e.g., components that can facilitate the attachment of the multi-tile module onto a roof batten) can be attached to the back side of the multi-tile module to complete the fabrication process (operation 1326).

The foregoing descriptions of various embodiments have been presented only for purposes of illustration and description. They are not intended to be exhaustive or to limit the present system to the forms disclosed. Accordingly, many modifications and variations will be apparent to practitioners skilled in the art. Additionally, the above disclosure is not intended to limit the present system.

What is claimed is:

1. A photovoltaic roof module, comprising:
    a plurality of photovoltaic roof tiles positioned side by side, wherein a respective photovoltaic roof tile comprises a plurality of photovoltaic structures positioned between a front cover and a back cover, wherein the photovoltaic structures are electrically coupled to each other in series;
    a plurality of strain-relief connectors electrically coupling the plurality of photovoltaic roof tiles in parallel, each strain-relief connector of the plurality of strain-relief connectors comprising an elongated connection member vertically offset below and extending in a first direction beneath a corresponding photovoltaic structure, wherein a number of connection pads are arranged on the corresponding photovoltaic structure along a direction substantially parallel to the elongated connection member, and a number of curved metal wires discretely couple respective ones of the connection pads to the elongated connection member; and
    a metal tab disposed within the respective roof tile and extending in a second direction orthogonal to the first direction, wherein the elongated connection member is electrically and mechanically connected to the metal tab.

2. The photovoltaic roof module of claim 1, wherein a respective photovoltaic structure comprises a first edge busbar positioned near an edge of a first surface and a second edge busbar positioned near an opposite edge of a second surface, and wherein the plurality of photovoltaic structures is arranged in such a way that the first edge busbar of a first photovoltaic structure overlaps the second edge busbar of an adjacent photovoltaic structure, thereby forming a cascaded string.

3. The photovoltaic roof module of claim 2, wherein the photovoltaic roof tiles are electrically coupled to each other via metallic tabs, wherein a respective metallic tab is coupled to an edge busbar at an edge of the cascaded string.

4. The photovoltaic roof module of claim 3, wherein the strain-relief connector is attached to the edge busbar at the edge of the cascaded string and the metallic tab via electrically conductive adhesive.

5. The photovoltaic roof module of claim 1, wherein a respective photovoltaic structure is obtained by dividing a square or pseudo-square solar cell into three pieces.

6. The photovoltaic roof module of claim 5, wherein the respective photovoltaic roof tile comprises six serially coupled photovoltaic structures, and wherein the photovoltaic roof module comprises three photovoltaic roof tiles.

7. The photovoltaic roof module of claim 1, further comprising a pair of junction boxes for facilitating electrical coupling between the photovoltaic roof tile module and an adjacent photovoltaic roof tile module, wherein a junction box is mounted on the back cover of a particular photovoltaic roof tile.

8. The photovoltaic roof module of claim 7, wherein the junction box comprises:
    an attachment pad configured to electrically access photovoltaic structures encapsulated inside the particular photovoltaic roof tile via a through hole on the back cover of the particular photovoltaic roof tile; and
    a lead wire electrically coupled to the attachment pad, wherein at least a portion of the lead wire is protected by a weatherproof jacket.

9. The photovoltaic roof module of claim 1, wherein the curved metal wires are arranged in a serpentine configuration.

10. The photovoltaic roof module of claim 1, wherein the curved metal wires are each soldered or welded to the elongated connection member.

11. The photovoltaic roof module of claim 1, wherein the connection pads are arranged on a bus bar of the corresponding photovoltaic structure.

* * * * *